(12) United States Patent
Kang et al.

(10) Patent No.: US 7,829,929 B2
(45) Date of Patent: Nov. 9, 2010

(54) NON-VOLATILE MEMORY DEVICE AND NON-VOLATILE SEMICONDUCTOR INTEGRATED CIRCUIT DEVICE, INCLUDING THE SAME

(75) Inventors: Chang-Seok Kang, Seongnam-si (KR); Ki-Nam Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 283 days.

(21) Appl. No.: 12/070,422

(22) Filed: Feb. 19, 2008

(65) Prior Publication Data

US 2009/0206387 A1    Aug. 20, 2009

(51) Int. Cl.
*H01L 29/76* (2006.01)
(52) U.S. Cl. ............................... 257/314; 257/E21.422
(58) Field of Classification Search .................. 257/314, 257/315, 325, E21.422
See application file for complete search history.

(56) References Cited

U.S. PATENT DOCUMENTS

| | | | |
|---|---|---|---|
| 5,969,384 A | 10/1999 | Hong | |
| 6,335,554 B1 | 1/2002 | Yoshikawa | |
| 6,756,271 B1 | 6/2004 | Satoh et al. | |
| 6,791,140 B2 | 9/2004 | Prall | |
| 6,794,711 B2 | 9/2004 | Kang et al. | |
| 6,806,517 B2 | 10/2004 | Kim et al. | |
| 7,049,651 B2 | 5/2006 | Mikolajick et al. | |
| 2002/0081806 A1* | 6/2002 | Shin et al. | 438/257 |
| 2003/0198086 A1 | 10/2003 | Shukuri | |
| 2004/0021172 A1 | 2/2004 | Zheng et al. | |
| 2004/0183106 A1 | 9/2004 | Kim et al. | |
| 2005/0037577 A1 | 2/2005 | Kim et al. | |
| 2005/0156227 A1 | 7/2005 | Jeng | |
| 2006/0076609 A1 | 4/2006 | Chindalore et al. | |
| 2006/0086970 A1* | 4/2006 | Kim | 257/321 |
| 2006/0170032 A1 | 8/2006 | Bhattacharyya | |
| 2006/0205148 A1* | 9/2006 | Deppe et al. | 438/257 |

FOREIGN PATENT DOCUMENTS

| | | |
|---|---|---|
| CN | 1531107 | 9/2004 |
| JP | 2000-022008 | 1/2000 |
| KR | 1020060019299 A | 3/2006 |
| KR | 1020060035551 A | 4/2006 |

OTHER PUBLICATIONS

Eli Lusky, et al., Characterization of Channel Hot Electorn Injection by the Subthreshold Slope of NROM Device; IEEE Electron Device Letters, vol. 22, No. 11, Nov. 2001.

\* cited by examiner

*Primary Examiner*—Jerome Jackson, Jr.
*Assistant Examiner*—Paul A Budd
(74) *Attorney, Agent, or Firm*—Mills & Onello, LLP

(57) ABSTRACT

A non-volatile memory device has improved operating characteristics. The non-volatile memory device includes an active region; a wordline formed on the active region to cross the active region; and a charge trapping layer interposed between the active region and the wordline, wherein a cross region of the active region and the wordline includes an overlap region in which the charge trapping layer is disposed and a non-overlap region in which the charge trapping layer is not disposed.

13 Claims, 15 Drawing Sheets

NON-VOLATILE MEMORY DEVICE AND NON-VOLATILE SEMICONDUCTOR INTEGRATED CIRCUIT DEVICE, INCLUDING THE SAME

This application is related to U.S. patent application Ser. No. 11/167,051, filed Jun. 24, 2005, the content of which is incorporated herein by reference in its entirety, for all purposes.

BACKGROUND OF THE INVENTION

1. Field of the Invention

Embodiments of the present invention relate to a non-volatile memory device, and more particularly, to a non-volatile memory device having a charge trapping layer, a method of fabricating the non-volatile memory device, and a non-volatile semiconductor integrated circuit device including the non-volatile memory device.

2. Description of the Related Art

Non-volatile memory devices retain data stored therein even when the applied power supply is removed. For this reason, non-volatile memory devices enjoy widespread application in information communication devices such as digital cameras, mobile phones, personal digital assistants (PDAs), and MP3 players.

Non-volatile memory devices can be classified generally as floating gate-type memory devices and charge trap-type memory devices. A charge trap-type memory device includes a charge trapping structure, which is composed of an oxide film, a nitride film and an oxide film, on a substrate. A gate electrode is disposed on the charge trapping structure. Sidewalls of the gate electrode and the charge trapping structure are aligned with each other.

Since regions of the charge trapping structure near the sidewalls of the gate electrode are not included in a route along which electrons move, electrons cannot be injected into these regions of the charge trapping structures, or electrons injected into these regions cannot be removed. These regions affect the resulting threshold voltage of a transistor, thereby deteriorating device characteristics.

SUMMARY OF THE INVENTION

According to an aspect of the present invention, there is provided a non-volatile memory device including an active region; a wordline formed on the active region to cross the active region; and a charge trapping layer interposed between the active region and the wordline, wherein a cross region of the active region and the wordline includes an overlap region in which the charge trapping layer is disposed and a non-overlap region in which the charge trapping layer is not disposed.

In one embodiment, the non-overlap region is a region in which at least an end of the charge trapping region is recessed inwardly from an outer boundary of the cross region.

In another embodiment, the non-overlap region is a peripheral region of the cross region.

In another embodiment, the charge trapping layer comprises a silicon nitride film, a silicon oxynitride film, a metal oxide or metal oxynitride film of Al, Zr, Hf, La or an alloy of Al, Zr, Hf and La, or a combination of the same.

In another embodiment, the device further comprises: a tunneling layer interposed between the charge trapping layer and a semiconductor substrate; and a blocking layer interposed between the charge trapping layer and the wordline.

In another embodiment, the tunneling layer, the charge trapping layer, and the blocking layer extend along the wordline.

In another embodiment, sidewalls of the tunneling layer and sidewalls of the blocking layer are aligned with the outer boundary of the cross region, and at least an end of the charge trapping layer is inwardly recessed from the sidewalls of the tunneling layer and the sidewalls of the blocking layer.

In another embodiment, the device further comprises a filling insulation film filling recessed regions of the charge trapping layer, covering the active region, and having a top surface at the same level as the blocking layer.

In another embodiment, the device further comprises a filling insulation layer filling the recessed regions of the charge trapping layer and having sidewalls aligned with the outer boundary of the cross region.

In another embodiment, the sidewalls of the blocking layer are aligned with the outer boundary of the cross region, the sidewalls of the tunneling layer are aligned with sidewalls of the charge trapping layer, and at least an end of the charge trapping layer and at least an end of the tunneling layer are recessed inwardly from the sidewalls of the blocking layer.

In another embodiment, the device further comprises a mold mask filling the recessed regions of the charge trapping layer and recessed regions of the tunneling layer, covering the active region, and having a top surface at the same level as the charge trapping layer.

In another embodiment, the device further comprises an inter-layer insulation film filling the recessed regions of the charge trapping layer and the tunneling layer and having sidewalls aligned with the outer boundary of the cross region.

In another embodiment, the tunneling layer is formed on a surface of the semiconductor substrate, and wherein the blocking layer has sidewalls that are aligned with the outer boundary of the cross region.

According to another aspect of the present invention, there is provided a method of fabricating a non-volatile memory device. The method includes forming an active region in a semiconductor substrate forming a tunneling insulation film, a charge trapping insulation film, and a blocking insulation film on the semiconductor substrate; forming a blocking layer and a pre-charge trapping layer having sidewalls aligned with the blocking layer by etching the blocking insulation film and the charge trapping insulation film; forming a charge trapping layer which is recessed from at least an end of the blocking layer by selectively etching at least an end of the pre-charge trapping layer; and forming a wordline, which crosses the active region, on the blocking layer, wherein a cross region of the active region and the wordline includes an overlap region in which the charge trapping layer is disposed and a non-overlap region in which the charge trapping layer is not disposed.

In one embodiment, the method further comprises forming a tunneling layer aligned with the blocking layer by etching the tunneling insulation film after etching the charge trapping insulation film.

In another embodiment, the method further comprises: forming a hard mask pattern on the blocking insulation film before etching the blocking insulation film and the charge trapping insulation film; and removing the hard mask pattern before forming the wordline, wherein the blocking insulation film and the charge trapping insulation film are etched using the hard mask pattern as an etch mask.

In another embodiment, the method further comprises forming a filling insulation film before forming the hard mask pattern, wherein the removing of the hard mask pattern comprises planarizing the filling insulation film and the hard mask pattern.

In another embodiment, the method further comprises etching the filling insulation film using the wordline as an etch mask after forming the wordline.

According to another aspect of the present invention, there is provided a method of fabricating a non-volatile memory device. The method includes defining an active region in a semiconductor substrate; forming a mold mask, which has an aperture, on the semiconductor substrate; forming a tunneling layer and a charge trapping layer in the aperture; and forming a blocking layer and a wordline, which crosses the active region, on the charge trapping layer, wherein a cross region of the active region and the wordline includes an overlap region in which the charge trapping layer is disposed and a non-overlap region in which the charge trapping layer is not disposed.

In one embodiment, forming of the charge trapping layer comprises: forming a charge trapping insulation film on a surface of the semiconductor substrate which has the tunneling layer formed in the aperture; and planarizing the charge trapping insulation film.

In another embodiment, the method further comprises etching the mold mask using the wordline as an etch mask after forming the wordline.

According to another aspect of the present invention, there is provided a non-volatile semiconductor integrated circuit device including an active region defined by an isolation region; a plurality of wordlines formed on the active region to cross the active region; a plurality of impurity regions formed in the active region on both sides of each of the wordlines; and a plurality of charge trapping layers interposed between the active region and the wordlines, respectively, wherein a cross region of the active region and each of the wordlines includes an overlap region in which each of the charge trapping layers is disposed and a non-overlap region in which each of the charge trapping layers is not disposed.

In one embodiment, the device further comprises a string selection line and a ground selection line formed on the active region to cross the active region, wherein the wordlines are interposed between the string selection line and the ground selection line.

According to another aspect of the present invention, there is provided a non-volatile semiconductor integrated circuit device having two or more stacked non-volatile semiconductor integrated circuit layers. At least one of the non-volatile semiconductor integrated circuit layers includes an active region defined by an isolation region; a plurality of wordlines formed on the active region to cross the active region; a plurality of impurity regions formed in the active region on both sides of each of the wordlines; and a plurality of charge trapping layers interposed between the active region and the wordlines, respectively, wherein a cross region of the active region and each of the wordlines includes an overlap region in which each of the charge trapping layers is disposed and a non-overlap region in which each of the charge trapping layers is not disposed.

In another embodiment, the at least one of the non-volatile semiconductor integrated circuit layers further comprises a string selection line and a ground selection line formed on the active region to cross the active region, wherein the wordlines are interposed between the string selection line and the ground selection line.

BRIEF DESCRIPTION OF THE DRAWINGS

The above and other features and advantages of the embodiments of the present invention will become more apparent by describing in detail preferred embodiments thereof with reference to the attached drawings in which.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
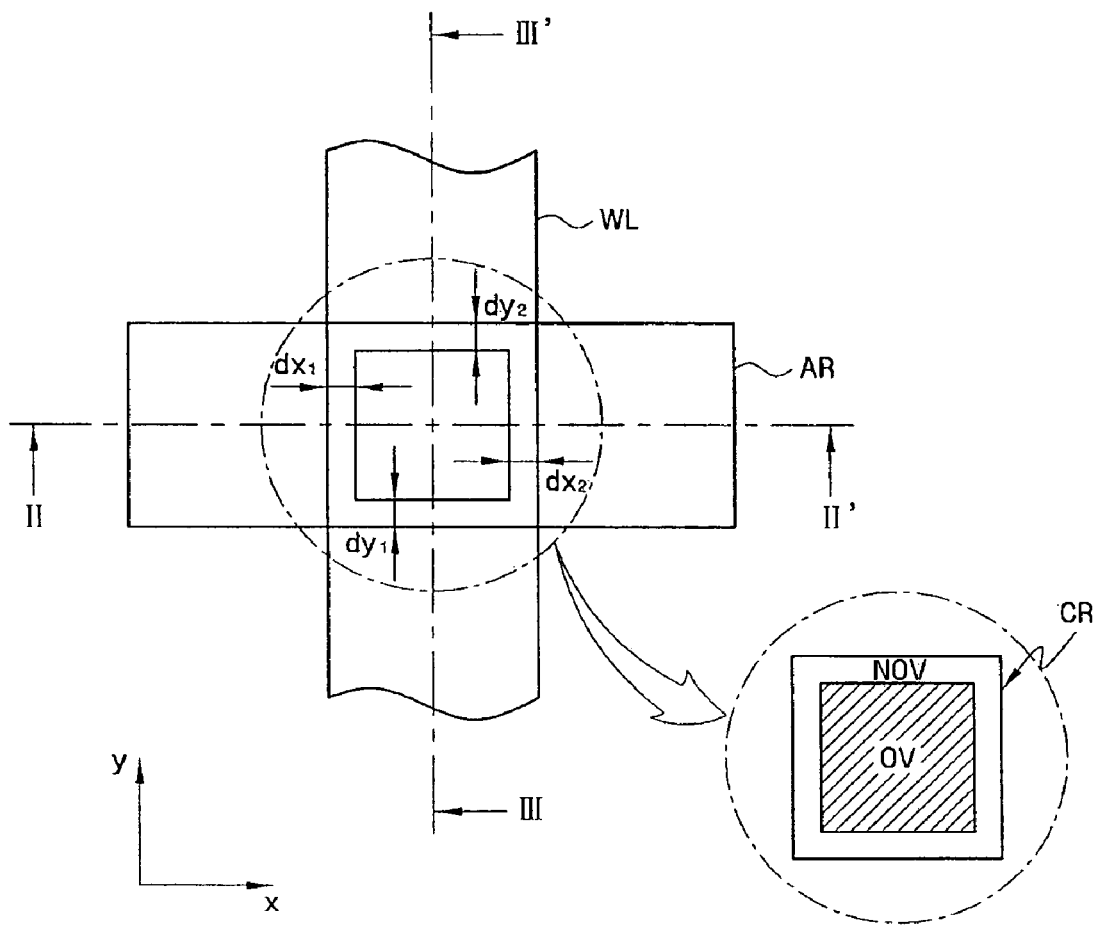
FIG. 1 is a layout of a non-volatile memory device according to an exemplary embodiment of the present invention.
Figure 2:
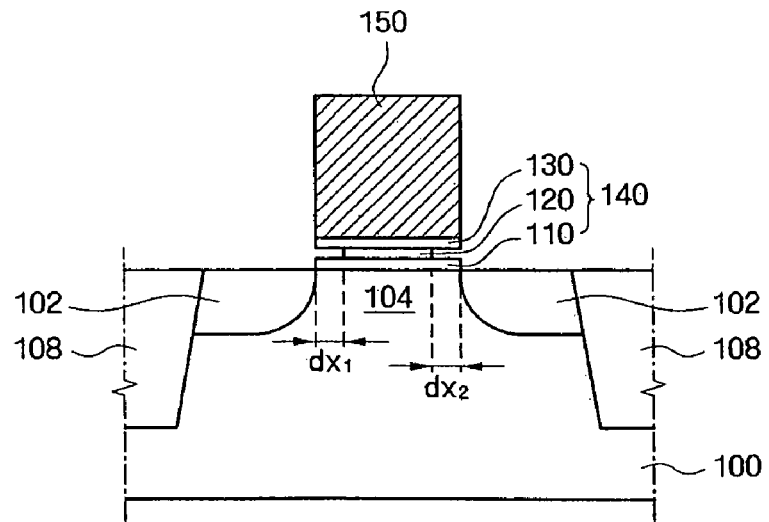
FIG. 2 is a cross-sectional view of the non-volatile memory device taken along section line II-II' of FIG. 1.
Figure 3:
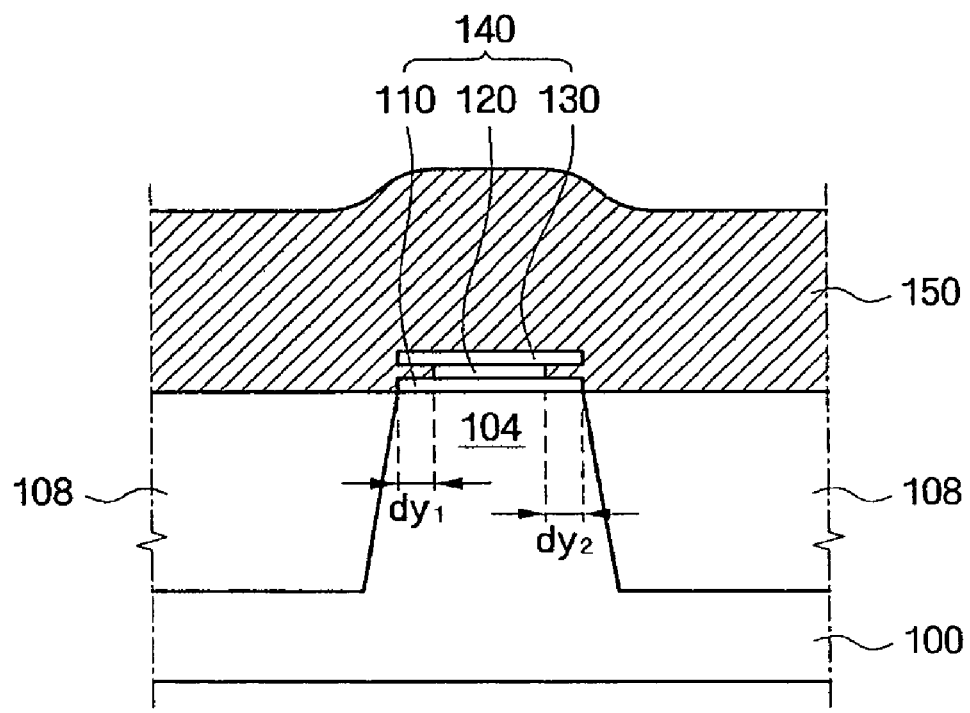
FIG. 3 is a cross-sectional view of the non-volatile memory device taken along section line III-III' of FIG. 1.

FIG. 1 is a layout of a non-volatile memory device according to an exemplary embodiment of the present invention. FIG. 2 is a cross-sectional view of the non-volatile memory device taken along section line II-II' of FIG. 1. FIG. 3 is a cross-sectional view of the non-volatile memory device taken along section line III-III' of FIG. 1.

Referring to FIGS. 1 through 3, the non-volatile memory device includes an active region AR, a wordline WL, and a charge trapping layer 120.

The active region AR is defined by forming, for example, an isolation region 108 in a semiconductor substrate 100. The isolation region 108 may be formed of a shallow trench isolation (STI) film or a local oxidation of silicon (LOCOS) film. A pattern of the active region AR may be modified in various ways. For example, an elongated active region pattern extending in an x direction is illustrated in FIG. 1.

The wordline WL is formed on the active region. The wordline WL may be made, for example, of a polysilicon film, a polysilicon film doped with impurities, a metal film, or a combination of two or more of the same. The metal film may be made of TaN, NiTa, Ti, TiN, Ta, W, WNx, Hf, Nb, Mo, RuOx, MoNx, Ir, Pt, Co, Cr, RuO, or a combination of the same. A thickness of the wordline WL may be approximately about 800 to about 2,000 Å (angstroms).

The wordline WL extends in, for example, a y direction which is substantially perpendicular to the x direction. Therefore, the wordline WL defines a cross region CR that crosses the active region AR. Impurity regions 102 are formed on both sides of the wordline WL in the active region. That is, a pair of impurity regions 102 are separated from each other with the wordline WL interposed therebetween.

The impurity regions 102 may be doped with impurities of a conductivity type opposite to that of the semiconductor substrate 100. In this case, if the semiconductor substrate 100 is a p-type substrate, the impurity regions 102 may be doped with n-type impurities. The n-type impurities may be phosphorous (P), arsenic (As), or antimony (Sb). Although not shown in the drawings, each of the impurity regions 102 may include a highly doped region and a lightly doped region.

Although not shown in the drawings, spacers may be formed on both sidewalls of the wordline WL. Each spacer may be used as a doping mask for dividing each of the impurity regions 102 into a highly doped region and a lightly doped region. For example, lightly doped regions may substantially aligned with both side surfaces of the wordline WL, whereas highly doped regions may be substantially aligned with outer side surfaces of the spacers.

A channel region 104 of a transistor is formed between the impurity regions 102. Generally, the channel region 104 matches the cross region CR of the active region AR and the wordline WL in the active region AR.

A portion of the wordline WL located in the cross region CR of the wordline WL and the active region AR forms a gate electrode 150 of the transistor. Therefore, in this specification, when the gate electrode 150 is mentioned, it may refer to the portion of the wordline WL, which extends in a predetermined direction, in the cross region CR of the wordline WL and the active region AR.

A charge trapping structure 140 including the charge trapping layer 120 is interposed between the gate electrode 150 and the active region AR. A charge trapping structure according to exemplary embodiments of the present invention is formed only in a cross region CR of an active region AR and a wordline WL. A charge trapping structure according to other exemplary embodiments of the present invention is not only formed in a cross region, but also extends along a wordline, for example, under the wordline.

The charge trapping layer 120 provides space into which electric charge is injected from the active region AR of the semiconductor substrate 100 and in which the electric charge is trapped. The charge trapping layer 120 may be made of a conductive material or a non-conductive material. When the charge trapping layer 120 is made of the conductive material, it may float between the semiconductor substrate 100 thereunder and the gate electrode 150 thereabove. Such floating may be accomplished using a tunneling layer 110 and a blocking layer 130 which will be described below.

In a case where the charge trapping layer 120 is made of the non-conductive material, it may be thinner than when made of the conductive material. For example, the charge trapping layer 120 can be formed to a thickness of approximately 30 to 100 Å (angstrom). Therefore, it may be desirable to form the charge trapping layer 120 of the non-conductive material in order to reduce the overall thickness of the resulting non-volatile memory device.

The non-conductive material, which can be applied as the charge trapping layer 120, may be silicon nitride, silicon oxy-nitride, a high dielectric constant (high-k) material, or a combination of the same. The high-k material may be metal oxide or metal oxynitride of Al, Zr, Hf, La or an alloy of Al, Zr, Hf and La. In a modified embodiment of the present invention, a multi-layer film having two or more stacked films may be applied as the charge trapping layer 120. For example, the multi-layer film may include a silicon nitride film and a high-k film stacked in an alternating manner. In a case where the charge trapping layer 120 is a multi-layer film, multi-level data storage is possible.

The charge trapping structure 140 may further include the tunneling layer 110 and/or the blocking layer 130. The tunneling layer 110 is interposed between the semiconductor substrate 100 and the charge trapping layer 120, and the blocking layer 130 is interposed between the charge trapping layer 120 and the gate electrode 150.

The tunneling layer 110 electrically insulates the semiconductor substrate 100 from the charge trapping layer 120. In addition, the tunneling layer 110 couples a voltage applied from the gate electrode 150 to the channel region 104 of the semiconductor substrate 100, thereby inverting the channel region 104. Furthermore, the tunneling layer 110 serves as a passage through which electrons from the semiconductor substrate 100 are injected into the charge trapping layer 120 or through which the electrons from the charge trapping layer 120 are discharged to the semiconductor substrate 100. The tunneling layer 110 may be made, for example, of silicon oxide or silicon oxynitride. In addition, the tunneling layer 110 may have a multi-layer structure in which a silicon oxide film, a silicon nitride film, and a silicon oxide film are sequentially stacked. A thickness of the tunneling layer 110 may be approximately 20 to 100 Å (angstroms).

The blocking layer 130 blocks electrons trapped in the charge trapping layer 120 from being discharged to the gate electrode 150. The blocking layer 130 may be an insulation film. As disclosed in U.S. Patent Publication No. 2004/0169238, incorporated herein by reference, the blocking layer 130 may be a high-k dielectric film, a double film composed of a high-k dielectric film and a silicon oxide film, a double film composed of a silicon oxide film and a high-k dielectric film, or a triple film composed of a silicon oxide film, a high-k dielectric film and a silicon oxide film. The high-k dielectric film may be metal oxide or metal oxynitride of an element that belongs to group III or group VB of a periodic table. The high-k dielectric film may be metal oxide or metal oxynitride doped with an element that belongs to group IV. Therefore, the high-k dielectric film may include at least one of $HfO_2$, $Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, Zr—Si-oxynitride, and a combination of the same. In addition, the high-k dielectric film may include at least one of $HfO_2$, $Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, Zr—Si-oxynitride, and a combination of the same. Technical features, which include the material of the blocking layer 130, are disclosed in U.S. Patent Publication No. 2004/0169238. A thickness of the blocking layer 130 may be approximately 50 to 250 Å.

The charge trapping layer 120 is located in the cross region CR of the wordline WL and the active region AR. At least an end of the charge trapping layer 120 is recessed inwardly from at least an end of an outer boundary of the cross region CR. Therefore, the cross region CR includes an overlap region OV which overlaps the charge trapping layer 120 disposed therein and a non-overlap region NOV in which the charge trapping layer 120 is not disposed.

The non-overlap region NOV occupies at least part of the periphery of the cross region CR. That is, the non-overlap region NOV may be located in the periphery of the cross region CR. Therefore, the non-overlap region NOV may be a region in which at least an end of the charge trapping layer 120 is recessed inwardly from the outer boundary of the cross region CR. The overlap region OV occupies a relatively central part of the cross region CR. Generally, the non-overlap region NOV is located at an outer periphery of the overlay region OV.

In FIG. 1, the non-overlap region NOV completely surrounds the overlap region OV. In this case, each of the distance values shown $dx_1$, $dx_2$, $dy_1$ and $dy_2$ is a positive number. If the non-overlap region NOV occupies at least part of the periphery of the cross region CR, at least one of $dx_1$, $dx_2$, $dy_1$ and $dy_2$ is a positive number, and the other ones are zero or negative numbers. If $dx_1$, $dx_2$, $dy_1$ and $dy_2$ are positive numbers, the charge trapping layer 120 is recessed from the cross region CR and thus completely included in the cross region CR. If $dx_1$, $dx_2$, $dy_1$ and $dy_2$ are zero, the charge trapping layer 120 is completely aligned with the outer boundary of the cross region CR. If $dx_1$, $dx_2$, $dy_1$ and $dy_2$ are negative numbers, the charge trapping layer 120 protrudes from the outer boundary of the cross region CR.

In the present embodiment illustrated in FIGS. 1 through 3, the tunneling layer 110 and the blocking layer 130 completely overlap the cross region CR. That is, the tunneling layer 110 and the blocking layer 130 are aligned with sidewalls of the gate electrode 150. Therefore, at least an end of the charge trapping layer 120 is recessed inwardly from the tunneling layer 110 and the blocking layer 130. In another exemplary embodiment of the present invention, the tunneling layer 110 and the blocking layer 130 may be misaligned with the gate electrode 150. In this case, the degree to which the tunneling layer 110 and the blocking layer 130 are misaligned with the gate electrode 150 may determine the degree to which the charge trapping layer 120 is recessed from the tunneling layer 110 and the blocking layer 130.

As described above, since the charge trapping layer 120 is recessed from at least an end of the outer boundary of the cross region CR of the wordline WL and the active region AR, operating characteristics of the non-volatile memory device can be enhanced. For example, the deterioration of the operating characteristics of the non-volatile memory device due to a reduction in the difference between a threshold voltage during a programming operation and a threshold voltage during an erase operation can be prevented.

If $dx_1$, $dx_2$, $dy_1$ and $dy_2$ are negative numbers, that is, if the charge trapping layer 120 protrudes outwardly from the boundary of the cross region CR of the wordline WL and the active region AR, a threshold voltage shift of the transistor increases as the programming operation and the erase operation are repeated. This may be the case because electrons injected into a protruded region of the charge trapping layer 120 are not removed from the protruded region during the erase operation and remain in the protruded region. Therefore, the charge trapping layer 120 can be formed without a protruded region in order to prevent the threshold voltage shift. That is, $dx_1$, $dx_2$, $dy_1$ and $dy_2$ may be zero or greater.

A direction in which electrons between the semiconductor substrate 100 and the charge trapping layer 120 move is determined by whether a method of injecting and erasing electrons is by hot electron injection or by Fowler-Nordheim (F—N) tunneling. If the hot electron injection method is applied, a direction in which electrons are injected is a vector sum of a direction of an electric field in a channel and a direction of an electric field toward the charge trapping layer 120. Therefore, if $dx_1$, $dx_2$, $dy_1$ and $dy_2$ are zero because the charge trapping layer 120 is aligned with the outer boundary of the cross region CR, electrons are not injected into at least part of the periphery of the charge trapping layer 120 or injected but not removed, which is accompanied by the threshold voltage shift. In order to prevent this situation, the charge trapping layer 120 may be recessed inwardly from the outer boundary of the cross region CR. That is, $dx_1$, $dx_2$, $dy_1$ and $dy_2$ are positive numbers. The above technical features are disclosed in detail in U.S. patent Ser. No. 11/167,051, incorporated herein by reference above.

When F-N tunneling is used to inject and remove electrons, a recessed structure of the charge trapping layer 120 can still improve the operating characteristics of the non-volatile memory device. That is, since an electric field generated by the gate electrode 150 usually acts in a vertical direction, it is primarily concentrated on the cross region CR. However, the effect of an electric field, which acts in a roundabout direction from each outer side of the gate electrode 150, cannot be ignored. In particular, an electric field is concentrated to a larger degree on an outer side surface of the gate electrode 150 than the interior thereof. Therefore, it is more difficult to control the injection and elimination of electrons as designed in a region adjacent to the outer side surface of the gate electrode 150 than in other regions. However, if the charge trapping layer 120 is recessed inwardly from the outer side surface of the gate electrode 150 (that is, the cross region CR of the wordline WL and the active region AR), electrons can be more accurately injected and removed.

FIGS. 4 through 8 are cross-sectional views of non-volatile memory devices according to another exemplary embodiment of the present invention. A description of elements similar to those of the previous embodiment described above will be omitted or simplified and the following description will be focused on differences between them.

Figure 4:
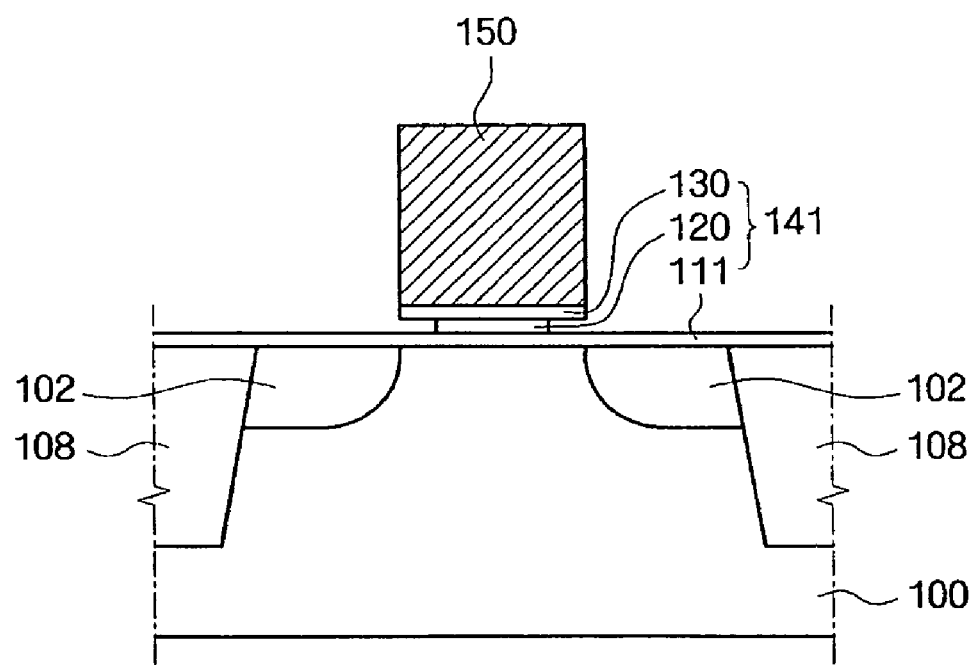
FIGS. 4 through 8 are cross-sectional views of non-volatile memory devices according to another exemplary embodiment of the present invention.

The embodiment of FIG. 4 is different from the previous embodiment of FIGS. 1 through 3 in that a tunneling layer 111 is formed on an entire surface of a semiconductor substrate 100. In this case, the charge trapping structure 141 including the tunneling layer 111, a charge trapping layer 120 and a blocking layer 130 is not necessarily disposed only in a cross region CR of the device, but can instead extend to other regions, since the tunneling layer 111 can extend in this manner. However, the present embodiment is similar to the previous embodiment in that at least the charge trapping layer 120 is disposed within the cross region CR and that at least an end of the charge trapping layer 120 is recessed inwardly from an outer boundary of the cross region CR.

Figure 5:
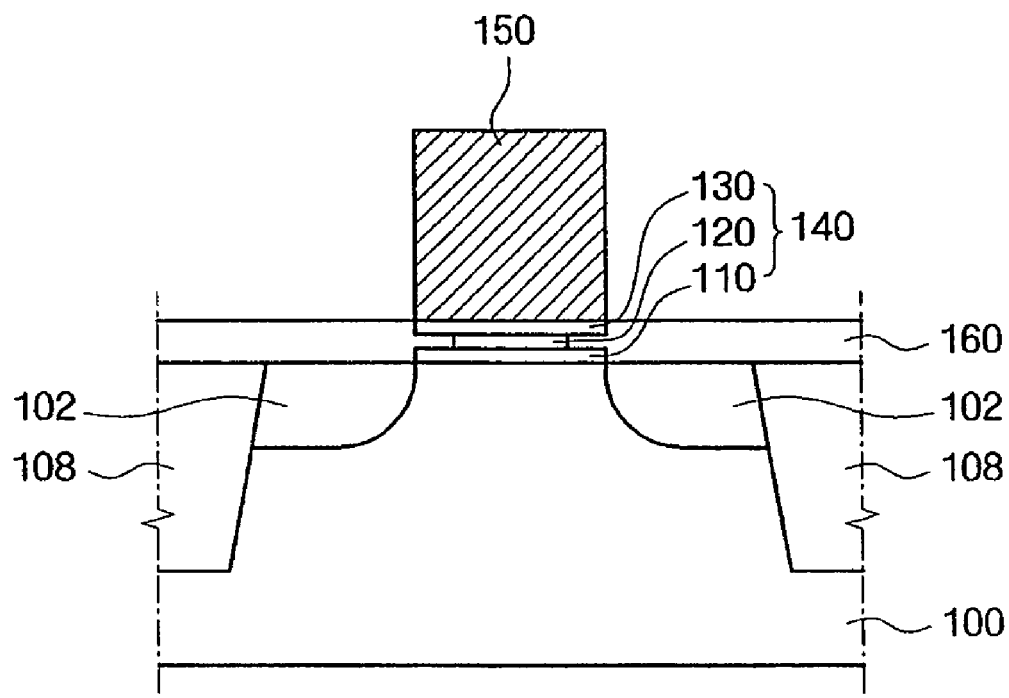

The embodiment of FIG. 5 is different from the previous embodiment of FIGS. 1 through 3 in that a filling insulation film 160 is formed. A top surface of the filling insulation film 160 is at the same level as a top surface of a charge trapping structure 140 (a top surface of a blocking layer 130). In addition, the filling insulation film 160 is formed on the entire surface of the semiconductor substrate 100 excluding a region where the charge trapping structure 140 is formed. That is, the top surface of the filling insulation film 160 and that of a charge trapping layer 120 are planarized. Furthermore, recessed regions of the charge trapping layer 120 are filled with the filling insulation film 160. The filling insulation film 160 may be a silicon oxide film formed by a chemical vapor deposition (CVD) process or a low pressure chemical vapor deposition (LPCVD) process. In a modified embodiment of the present embodiment, the recessed regions of the charge trapping layer 120 may not be buried by the filling insulation film 160 but instead may be left empty.

Figure 6:
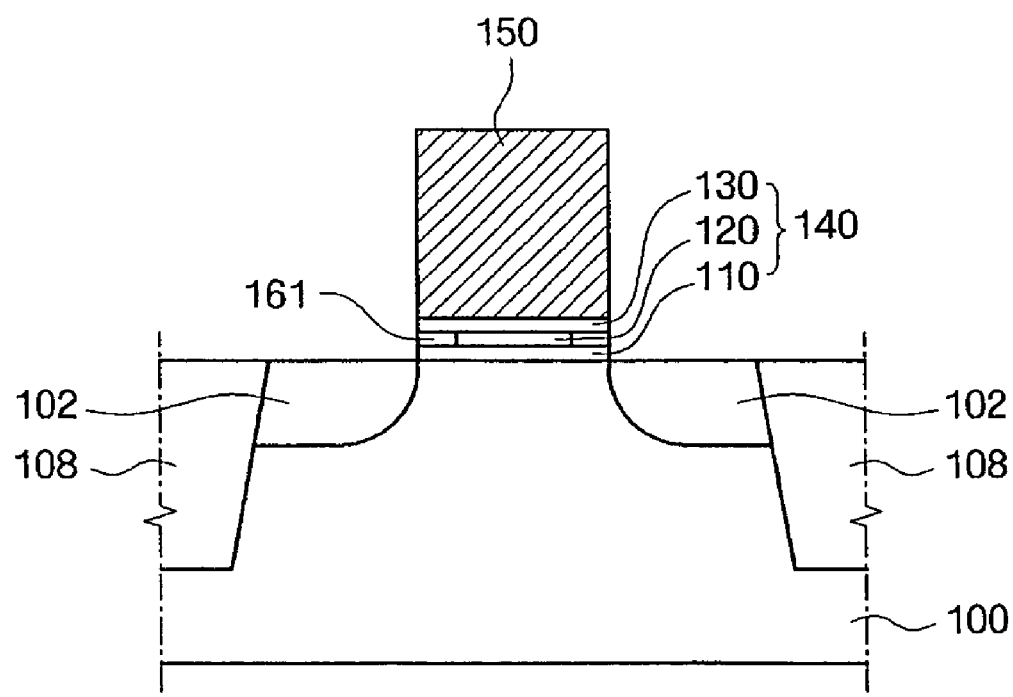
Figure 7:
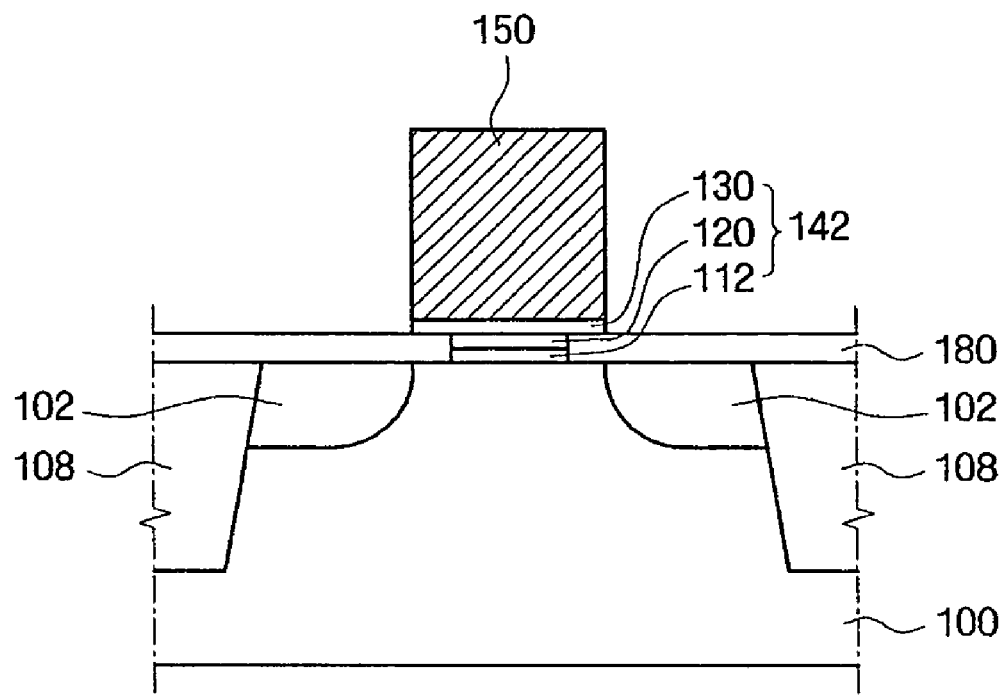

The embodiment of FIG. 6 is similar to the embodiment of FIG. 5 in that a filling insulation film 161 is formed. However, the embodiment of FIG. 6 is different from the embodiment of FIG. 5 in that the filling insulation film 161 does not remain to cover the whole surface of a semiconductor substrate 100, and is instead patterned. Specifically, the filling insulation film 161 is patterned so as to be aligned with sidewalls of a gate electrode 150. That is, the non-volatile memory device illustrated in FIG. 6 is substantially similar to a structure obtained after the filling insulation film 160 of the non-volatile memory device illustrated in FIG. 5 is etched using the gate electrode 150 as an etch mask The non-volatile memory device according to the embodiment of FIG. 7 includes a mold mask 180. The mold mask 180 may be made, for example, of silicon oxide or a high-k film. The mold mask 180 includes an aperture that defines a region where a charge trapping layer 120 is to be formed. The aperture of the mold mask 180 may also define a region where a tunneling layer 112 is to be formed. Accordingly, in some exemplary embodiments of the present invention, the tunneling layer 112 and the charge trapping layer 120 may have the same pattern as illustrated in FIG. 7. That is, sidewalls of the tunneling layer 112 are aligned with those of the charge trapping layer 120. Therefore, it can be understood that the tunneling layer 112 as well as the charge trapping layer 120 is recessed inwardly from the gate electrode 150 (a cross region). A blocking layer 130 is disposed on the charge trapping layer 120 and the mold mask 180 and protrudes outwardly further than the charge trapping layer 120 and the tunneling layer 112 thereunder. Although the tunneling layer 112 is recessed, since the mold mask 180 may be made of a material substantially similar to that of the tunneling layer 112, electrical characteristics of a charge trapping structure 142 of FIG. 7 may be similar to those of the charge trapping structure 141 of FIG. 4 in which the tunneling layer 111 is formed on the whole surface of the semiconductor substrate 100.

Figure 8:
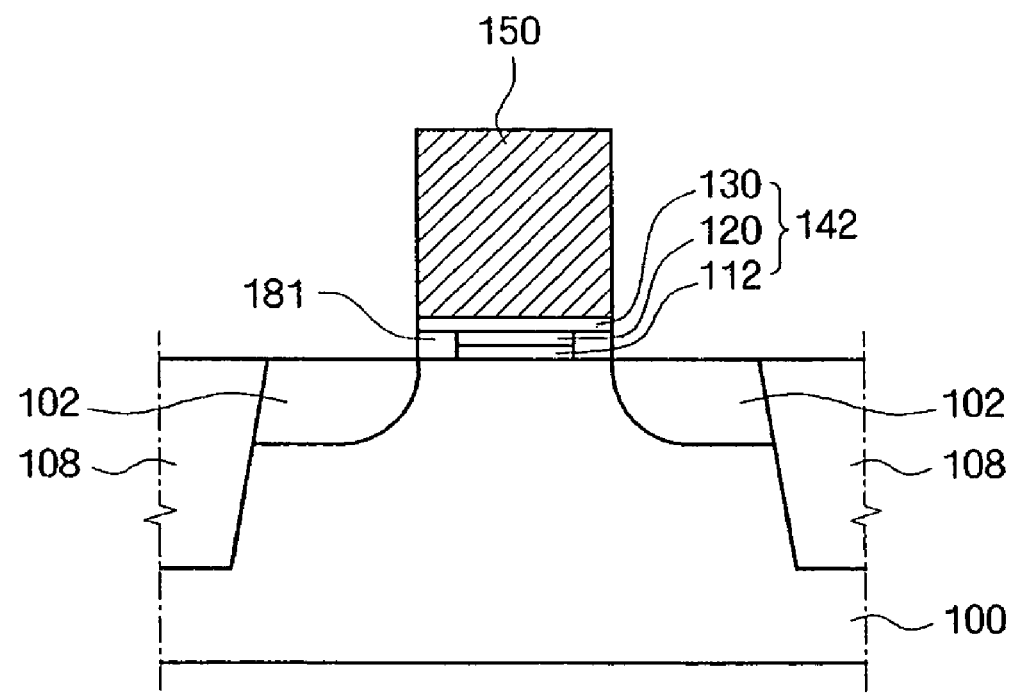

FIG. 8 illustrates a structure in which a mold mask 181 is patterned so as to be aligned with sidewalls of a gate electrode 150. That is, the non-volatile memory device according to the embodiment of FIG. 8 is substantially similar to a structure obtained after the mold mask 180 of the non-volatile memory device illustrated in FIG. 7 is etched using the gate electrode 150 as an etch mask. Although a tunneling layer 112 is recessed in the present embodiment, if the mold mask 181 is made of a material substantially similar to that of a tunneling layer 112, electrical characteristics of a charge trapping structure 142 of FIG. 8 may be similar to those of the charge trapping structure 140 of FIG. 2.

In the embodiments of FIGS. 4 through 8, at least an end of a charge trapping layer is recessed inwardly from the gate electrode (a cross region). Therefore, operating characteristics of the non-volatile memory devices according to the embodiments of FIGS. 4 through 8 can be enhanced for the same reasons described above with reference to FIGS. 1 through 3.

Hereinafter, methods of fabricating a non-volatile memory device such as those described above will be described. In the following embodiments, a description of components, structures, shapes, materials and sizes already mentioned will be omitted.

Figure 9:
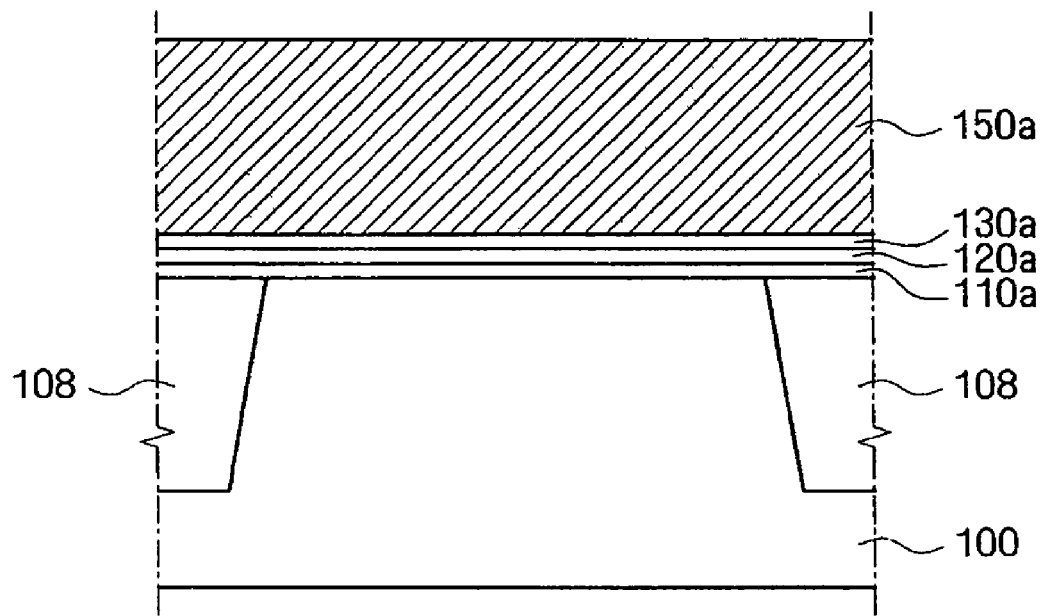
FIGS. 9 through 11 are cross-sectional views sequentially illustrating processing steps included in a method of fabricating a non-volatile memory device according to an exemplary embodiment of the present invention.
Figure 10:
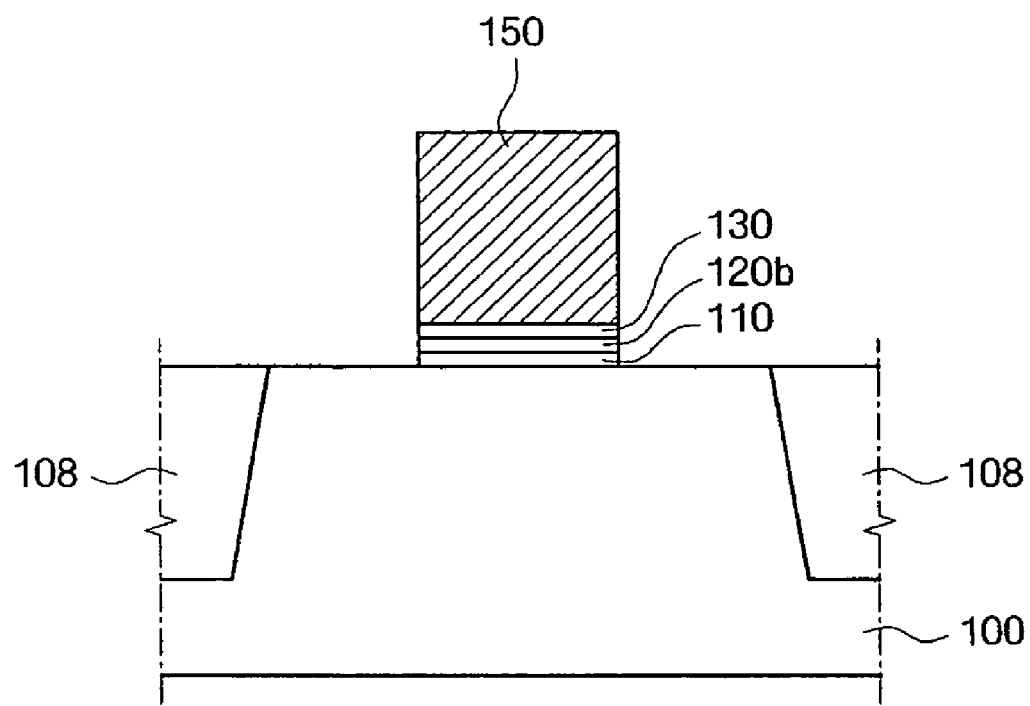
Figure 11:
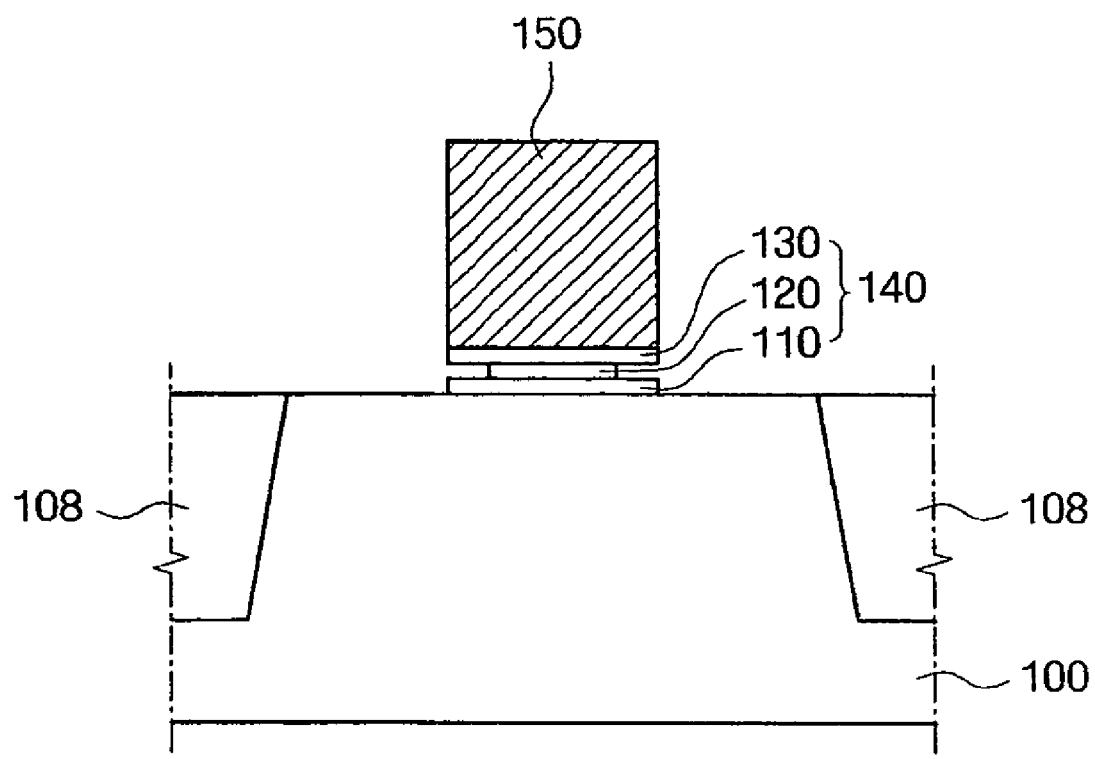

FIGS. 9 through 11 are cross-sectional views sequentially illustrating processing steps included in a method of fabricating a non-volatile memory device according to an exemplary embodiment of the present invention. The processing processes illustrated in FIGS. 9 through 11 can be effectively applied to fabricate the non-volatile memory device of FIG. 2.

Referring to FIG. 9, an isolation region 108 is formed in a semiconductor substrate 100, thereby defining an active region. The isolation region 108 can be formed using technology well-known in the art, such as a shallow trench isolation (STI) process or a local oxidation of silicon (LOCOS) process.

Then, a tunneling insulation film 110*a*, a charge trapping insulation film 120*a*, and a blocking insulation film 130*a* are sequentially stacked on the semiconductor substrate 100. In this case, the tunneling insulation film 110*a* may be formed by a thermal oxidation process using a furnace process or a rapid thermal process (RTP), or by the CVD process. The charge trapping insulation film 120*a* and the blocking insulation film 130*a* may be formed by the CVD process or the LPCVD process. These methods for formation of the layers are mere examples, and various other methods may be used to form the above films.

Next, a conductive film 150*a* for a gate electrode or wordline, is formed on the blocking insulation film 130*a*.

Referring to FIG. 10, the conductive film 150*a* for a gate electrode, the blocking insulation film 130*a*, the charge trapping insulation film 120*a*, and the tunneling insulation film 110a are sequentially or simultaneously etched. In this case, a photoresist pattern or a hard mask may be used as an etch mask. In addition, an isotropic etching process may be used. As a result of the etching process, a gate electrode 150, a blocking layer 130, a pre-charge trapping layer 120b and a tunneling layer 110, which have substantially similar patterns and have sidewalls aligned with each other, are formed. Here, the pre-charge trapping layer 120b refers to a pattern which has not yet been completed as a charge trapping layer, that is, a pattern which has been patterned but not yet recessed from at least an end of the gate electrode 150. In order to fabricate the non-volatile memory device of FIG. 4, the tunneling insulation film 110a is not etched in the present processing process of FIG. 10.

Referring to FIG. 11, at least an end of the pre-charge trapping layer 120b is etched. As a result, a charge trapping layer 120 recessed from at least an end of the gate electrode 150 is formed. In the present processing process, the pre-charge trapping layer 120a may be selectively etched. To this end, an anisotropic etching process may be applied. Here, it is obvious that a material having a higher etch selectivity for the pre-charge trapping layer 120a than for the gate electrode 150, the tunneling layer 110 and the blocking layer 130 is used. The etching process may be a wet etching process in which phosphoric acid is used as an etching solution.

Next, impurity regions 102 are formed by doping impurity ions into the semiconductor substrate 100 using the gate electrode 150 as a doping mask. As a result, a non-volatile memory device as the one illustrated in FIG. 2 is completed.

In the present processing process, a charge trapping structure pattern is formed after a wordline is formed. Therefore, all of the tunneling layer 110, the charge trapping layer 120 and the blocking layer 130 extend along the wordline. That is, the charge trapping layer 120 is not recessed in the y direction of FIG. 1.

FIGS. 12 through 15 are cross-sectional views sequentially illustrating processing steps included in a method of fabricating a non-volatile memory device according to another exemplary embodiment of the present invention. The method of FIGS. 12 through 15 may be used to fabricate the non-volatile memory device of FIG. 2.

Figure 12:
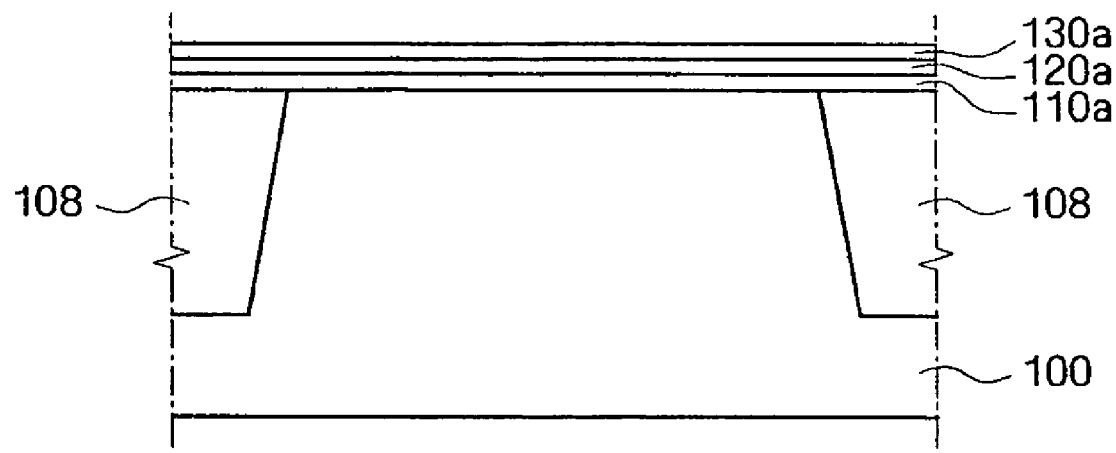
FIGS. 12 through 15 are cross-sectional views sequentially illustrating processing steps included in a method of fabricating a non-volatile memory device according to another exemplary embodiment of the present invention.

Referring to FIG. 12, the present embodiment is similar to the embodiment of FIG. 9 in that an isolation region 108 is formed in a semiconductor substrate 100 and that a tunneling insulation film 110a, a charge trapping insulation film 120a and a blocking insulation film 130a are sequentially formed. However, they are different in that a conductive film for a gate electrode is not yet formed in the present processing process of FIG. 12.

Figure 13:
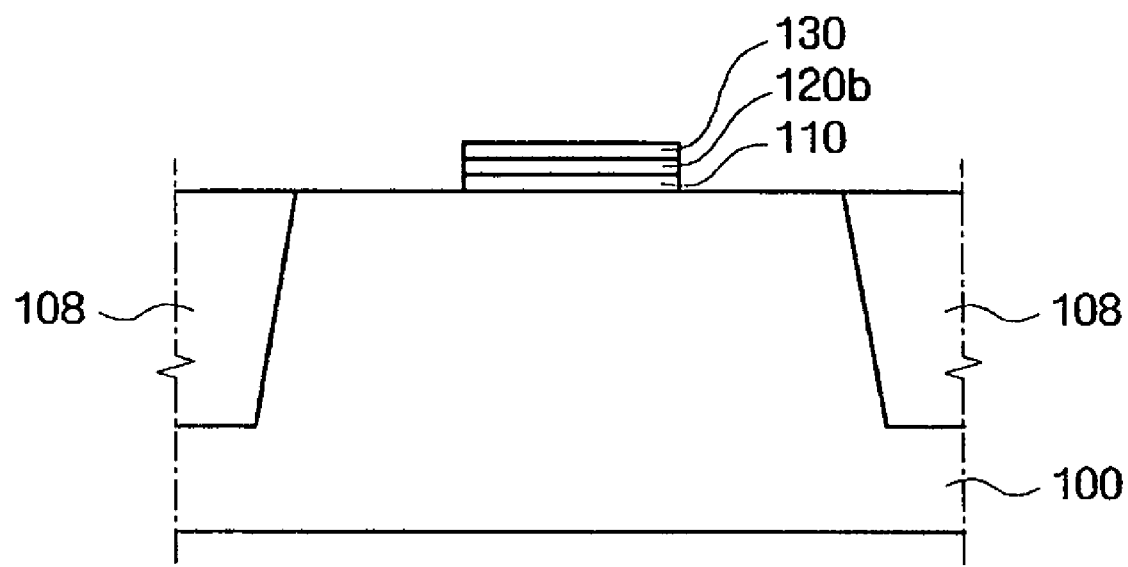

Referring to FIG. 13, the blocking insulation film 130a, the charge trapping insulation film 120a, and the tunneling insulation film 110a are etched. As a result, a blocking layer 130, a pre-charge trapping layer 120b, and a tunneling layer 110 are formed.

Figure 14:
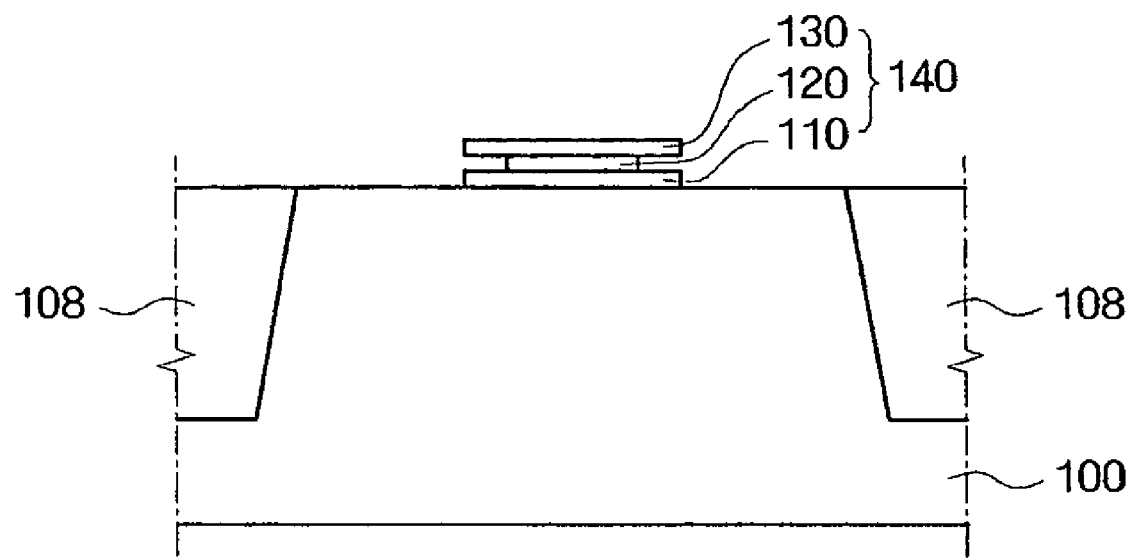

Referring to FIG. 14, at least an end of the pre-charge trapping layer 120b is etched. As a result, a charge trapping layer 120 having at least an end recessed from the blocking layer 130 and the tunneling layer 110 is formed. The present processing step is substantially similar to that of FIG. 11 described above.

Figure 15:
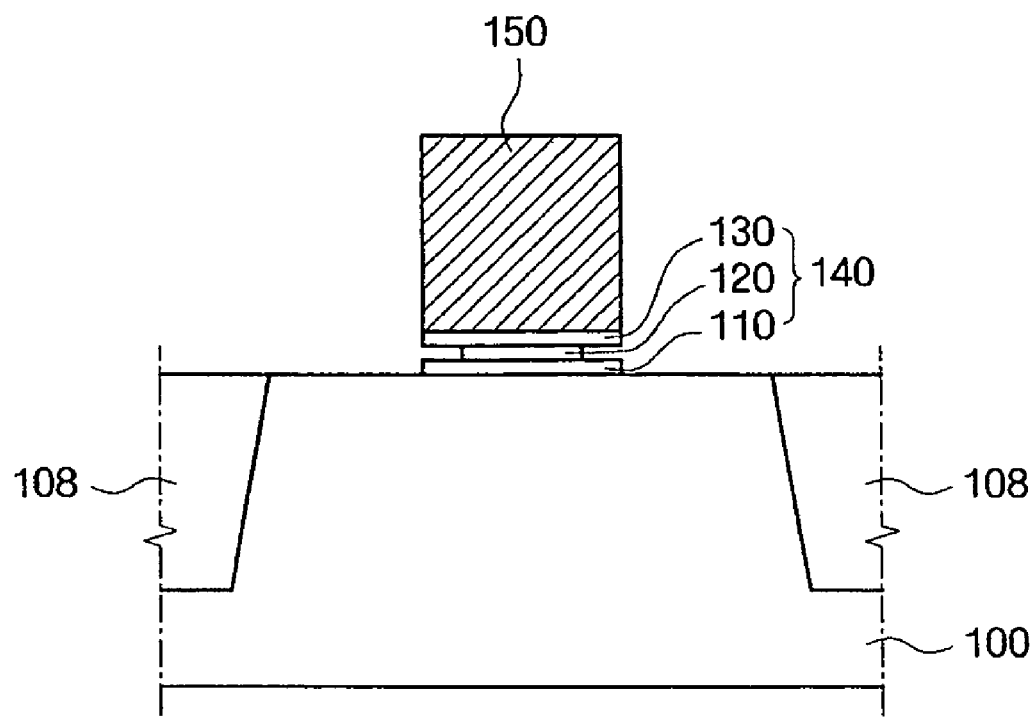

Referring to FIG. 15, a conductive film for a gate electrode is formed on the blocking layer 130 and then patterned. As a result, a gate electrode 150 aligned with sidewalls of the blocking layer 130 is formed. Accordingly, the charge trapping layer 120 is recessed inwardly from the gate electrode 150. Next, impurity ions are doped into the semiconductor substrate 100 using the gate electrode 150 as a doping mask. As a result, a non-volatile memory device as the one illustrated in FIG. 2 is completed.

In the present processing process, the gate electrode 150 is formed after a charge trapping structure 140 is formed. Therefore, the charge trapping structure 140 can be patterned regardless of the direction in which the wordline extends. That is, when necessary, the charge trapping structure 140 may be patterned to be disposed only in a cross region of the wordline and an active region. Thus, the present embodiment is different from the embodiment of FIGS. 9 through 11 in that the charge trapping layer 120 can be recessed in the y direction as well as the x direction of FIG. 1. The same process can be applied to other embodiments described herein. That is, the order in which a charge trapping layer and a gate electrode are formed may determine a pattern shape of the charge trapping layer and a direction in which the charge trapping layer can be recessed.

FIGS. 16 through 21 are cross-sectional views sequentially illustrating processing steps included in a method of fabricating a non-volatile memory device according to another exemplary embodiment of the present invention. The method of FIGS. 16 through 21 may be used to fabricate the non-volatile memory devices of FIGS. 5 and 6.

Figure 16:
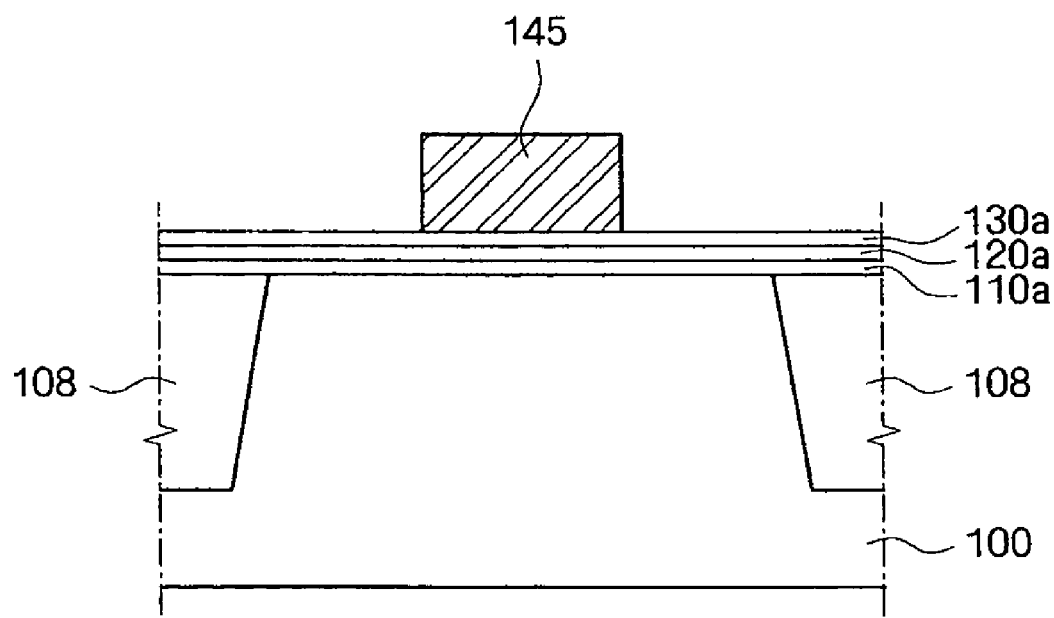
FIGS. 16 through 21 are cross-sectional views sequentially illustrating processing steps included in a method of fabricating a non-volatile memory device according to another exemplary embodiment of the present invention.

Referring to FIG. 16, the present embodiment is similar to the embodiment of FIG. 9 in that an isolation region 108 is formed in a semiconductor substrate 100 and in that a tunneling insulation film 110a, a charge trapping insulation film 120a and a blocking insulation film 130a are sequentially formed. Next, a hard mask pattern 145, which defines a charge trapping structure, is formed on the blocking insulation film 130a. The hard mask pattern 145 can be made, for example, of silicon oxide or silicon oxynitride.

Figure 17:
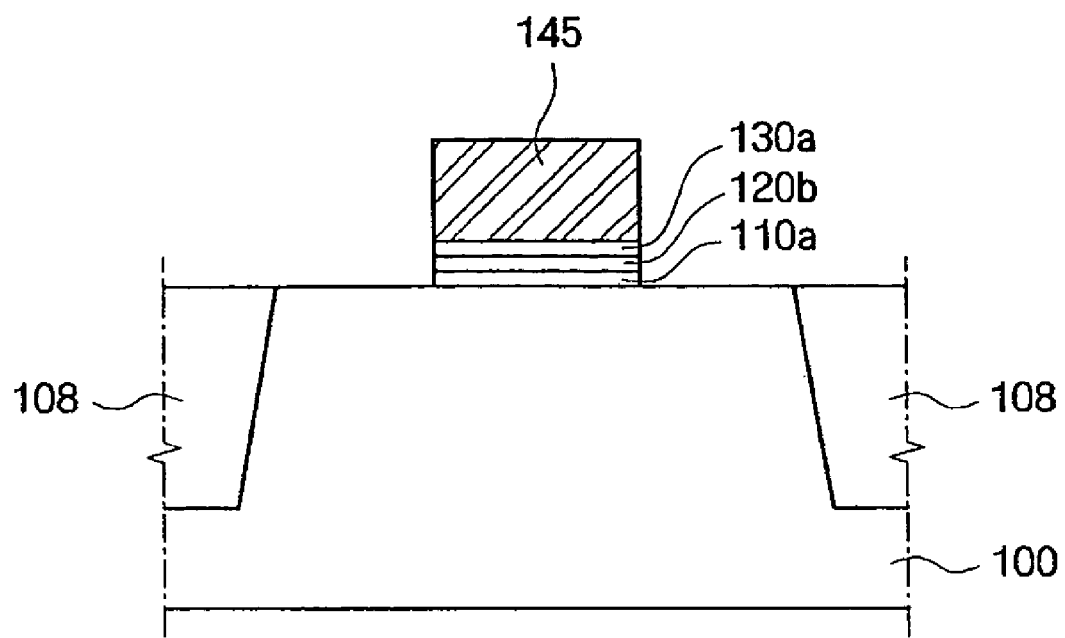

Referring to FIG. 17, the blocking insulation film 130a, the charge trapping insulation film 120a, and the tunneling insulation film 110a are etched using the hard mask pattern 145 as an etch mask. As a result, a blocking layer 130a, a pre-charge trapping layer 120b, and a tunneling layer 110a are formed.

Figure 18:
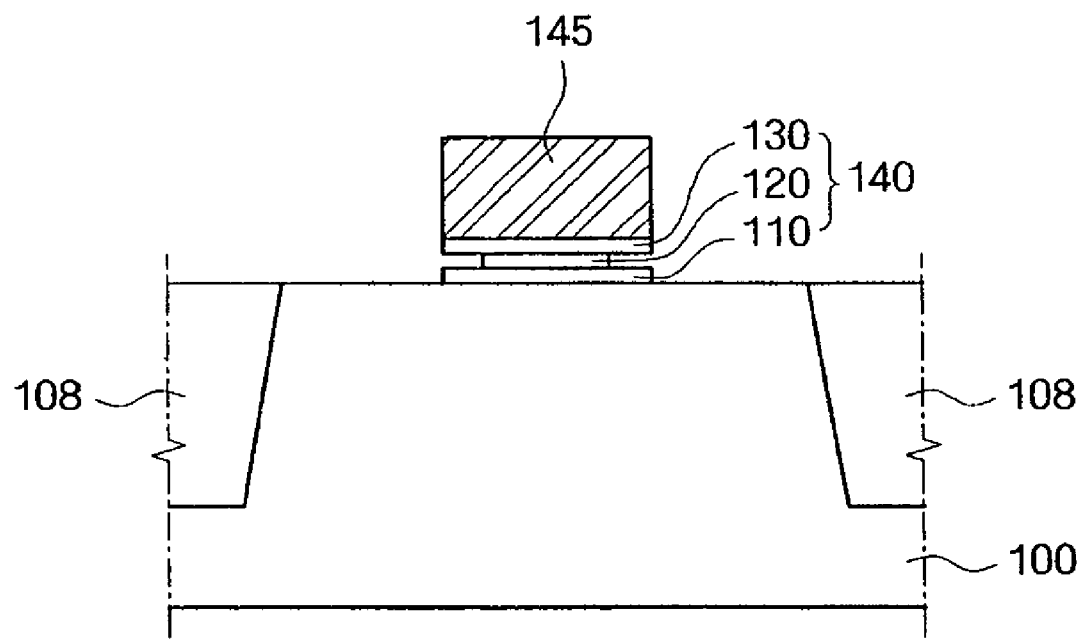

Referring to FIG. 18, at least an end of the pre-charge trapping layer 120b is etched. As a result, a charge trapping layer 120 having at least an end recessed from the blocking layer 130 and the tunneling layer 110 is formed. The present processing step is substantially similar to that of FIG. 14.

Figure 19:
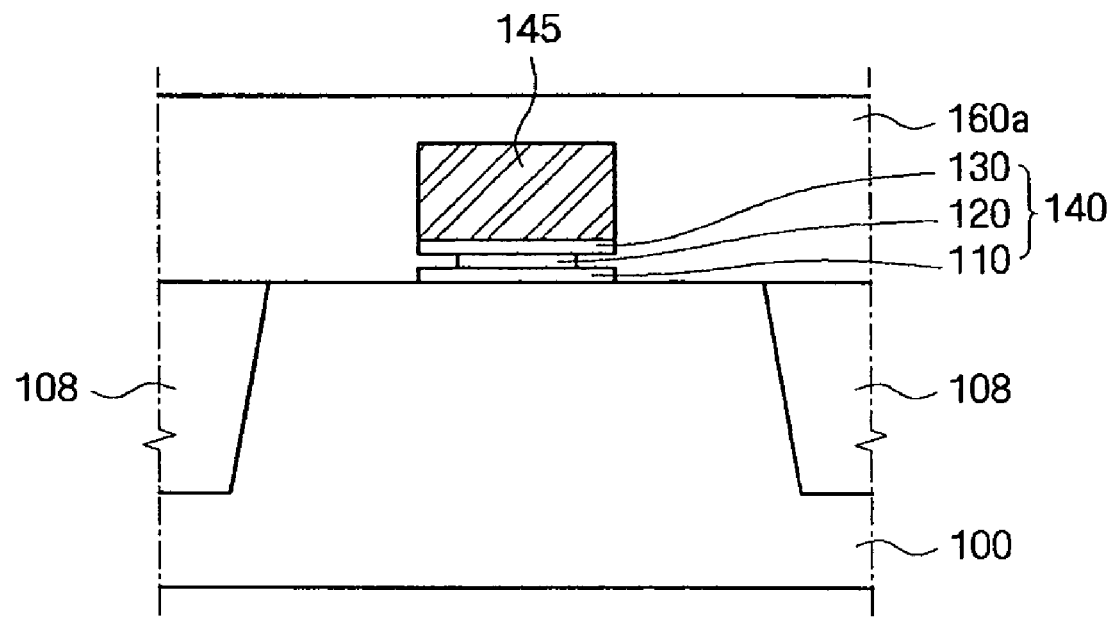

Referring to FIG. 19, a filling insulation film 160a is formed on a whole surface of a resultant structure of FIG. 18. In this case, the filling insulation film 160a may be formed to a level higher than a top surface of the hard mask pattern 145 in order to secure a margin in a subsequent planarization process.

Figure 20:
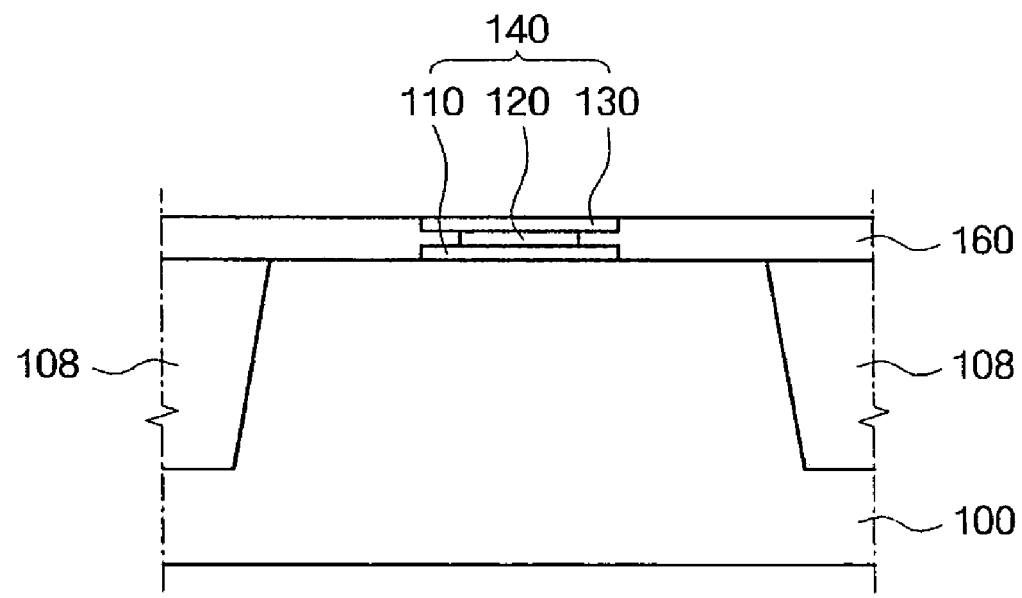

Referring to FIG. 20, the filling insulation film 160a and the hard mask pattern 145 are planarized using the blocking layer 130 as a planarization stopper. The planarization process may be a chemical mechanical polishing (CMP) process. As a result of the planarization process, the hard mask pattern 145 is removed, and a top surface of the blocking layer 130 is exposed. In addition, a filling insulation film 160 is disposed at the same level as the blocking layer 130.

Figure 21:
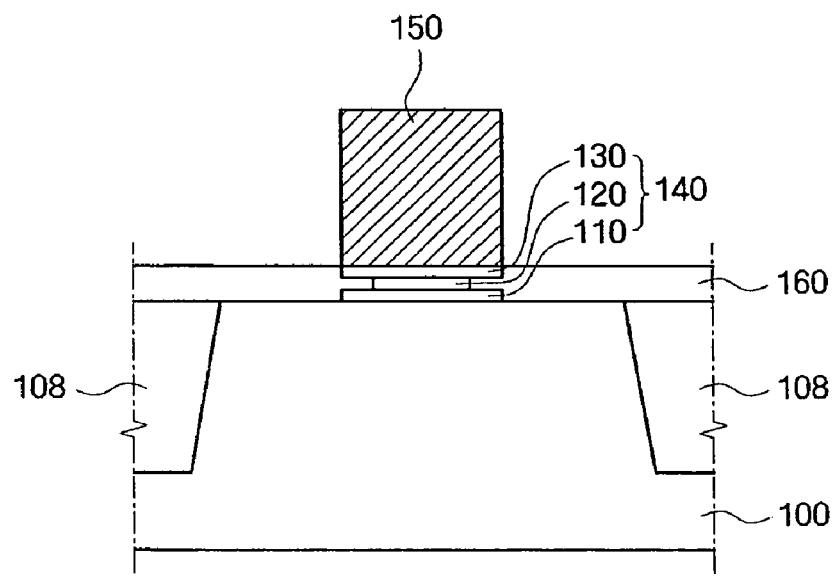

Referring to FIG. 21, a gate electrode 150 is formed on the blocking layer 130. Next, impurity ions are doped into the semiconductor substrate 100 using the gate electrode 150 as a doping mask. As a result, a non-volatile memory device as the one illustrated in FIG. 5 is completed. The impurity regions 102 included in the non-volatile memory device of FIG. 5 may be formed before the filling insulation film 160 is formed. In order to fabricate the non-volatile memory device of FIG. 6, after the gate electrode 150 is formed, the filling insulation film 160 is continuously etched using the gate electrode 150 as an etch mask.

FIGS. 22 through 25 are cross-sectional views sequentially illustrating processing steps included in a method of fabricating a non-volatile memory device according to another exemplary embodiment of the present invention. The method of FIGS. 22 through 25 may be used to fabricate the non-volatile memory devices of FIGS. 7 and 8.

Figure 22:
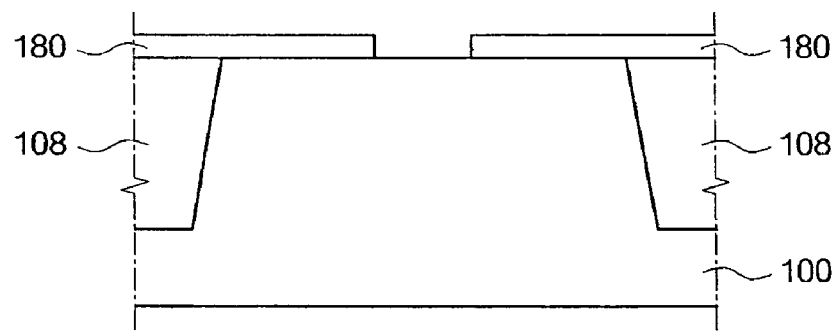
FIGS. 22 through 25 are cross-sectional views sequentially illustrating processing steps included in a method of fabricating a non-volatile memory device according to another exemplary embodiment of the present invention.

Referring to FIG. 22, an isolation region 108 is formed in a semiconductor substrate 100. Then, a mold mask 180 having an aperture, which defines a region where a charge trapping layer is to be formed, is formed on the semiconductor substrate 100. The mold mask 180 may be formed to a thickness substantially equal to a sum of thicknesses of a tunneling layer and a charge trapping layer or may be formed to a thickness slightly greater than the sum in consideration of a margin of a subsequent planarization process.

Figure 23:
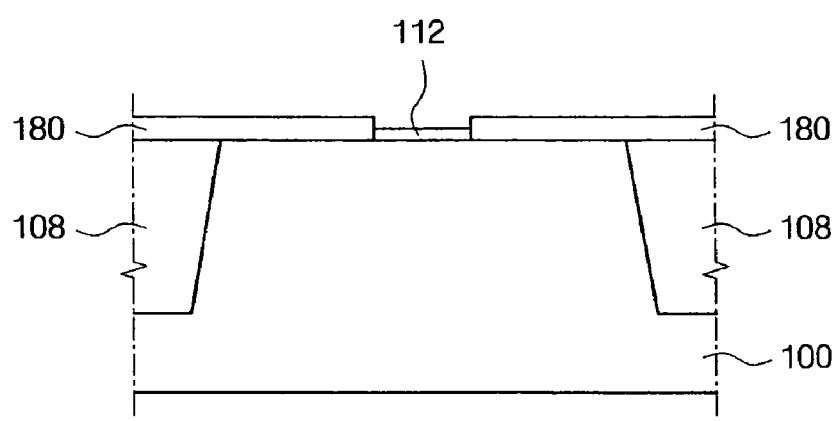

Referring to FIG. 23, a thermal oxidation process is performed on a surface of a region of the semiconductor substrate 100 exposed by the aperture of the mold mask 180, thereby forming a tunneling layer 112. When the thermal oxidation process is used, the tunneling layer 112 is grown only in the region of the semiconductor substrate 100 exposed by the mold mask 180. Therefore, no separate patterning is required.

Figure 24:
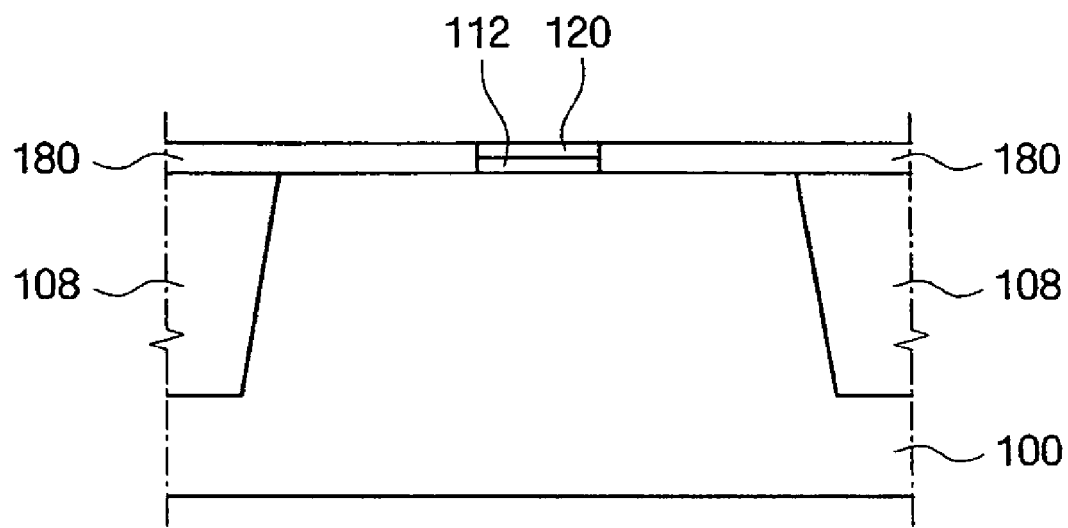

Referring to FIG. 24, a charge trapping insulation film is formed on a whole surface of a resultant structure of FIG. 23. Then, the charge trapping insulation film is planarized using the mold mask 180 as a planarization stopper. As a result, a charge trapping layer 120 is formed on the tunneling layer 112 in the aperture of the mold mask 180. The charge trapping layer 120 is self-aligned with the aperture of the mold mask 180 without requiring a separate photolithography process.

Figure 25:
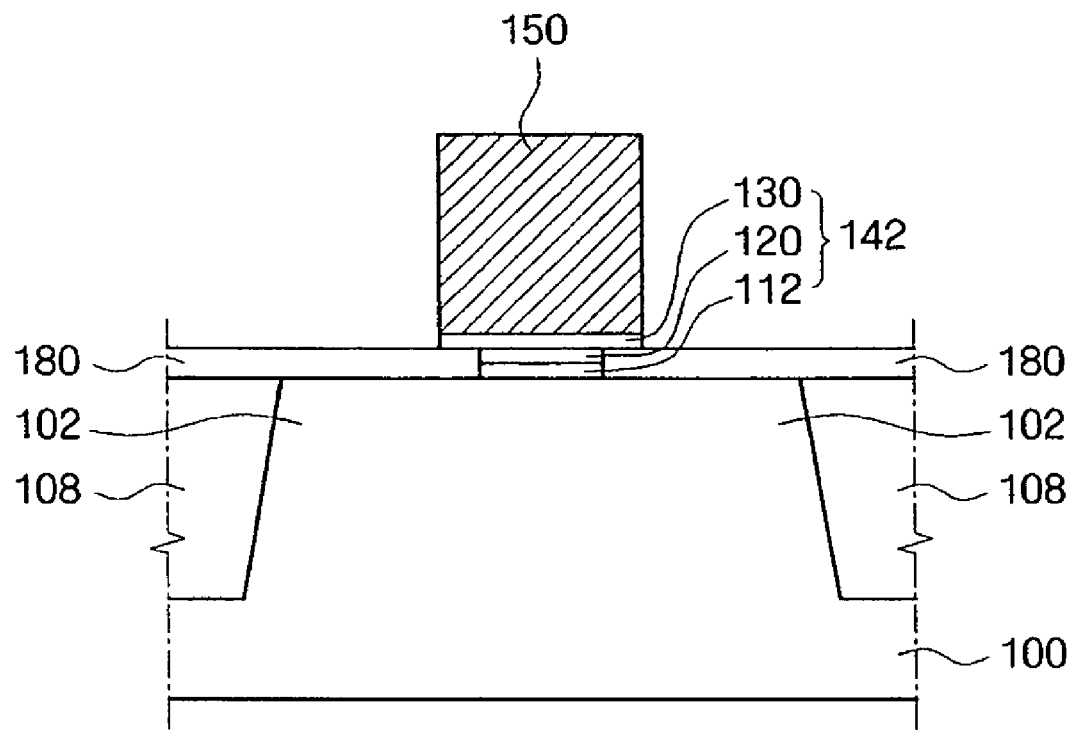

Referring to FIG. 25, a blocking insulation film and a conductive film for a gate electrode are formed. Then, a gate electrode 150 and a blocking layer 130 are formed by patterning the conductive film for a gate electrode and the blocking insulation film. Here, a charge trapping layer 120 having at least an end recessed from a sidewall of the gate electrode 150 is formed. Next, impurity ions are doped into the semiconductor substrate 100 using the gate electrode 150 as a doping mask. As a result, a non-volatile memory device as the one illustrated in FIG. 7 is completed. In order to fabricate the non-volatile memory device of FIG. 8, the mold mask 180 is further etched after the blocking layer 130 is formed.

In the present embodiment, since the charge trapping layer 120 is self-aligned with the aperture of the mold mask 180, there is no need to selectively etch a pre-charge trapping layer as in the previous embodiments.

The non-volatile memory devices described above can be applied to NAND-type non-volatile semiconductor integrated circuit devices, and examples of such NAND-type non-volatile semiconductor integrated circuit devices will hereinafter be described. However, it should be understood that the non-volatile memory devices according to the exemplary embodiments of the present invention can also be applied to NOR-type non-volatile semiconductor integrated circuit devices.

Figure 26:
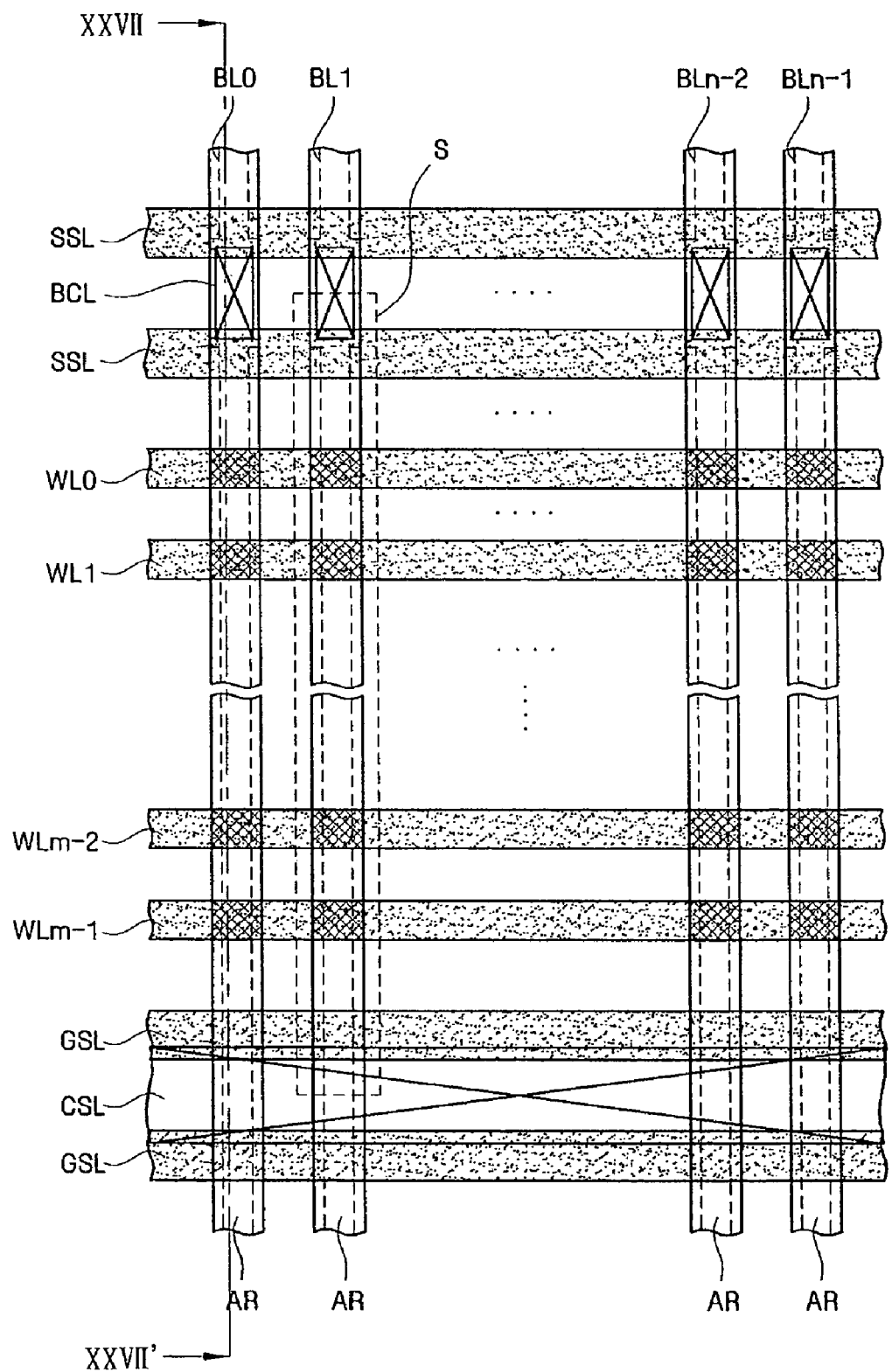
FIG. 26 is a layout of a non-volatile semiconductor integrated circuit device according to an exemplary embodiment of the present invention.

FIG. 26 is a layout of a non-volatile semiconductor integrated circuit device according to an exemplary embodiment of the present invention.

Referring to FIG. 26, a plurality of active regions ARs are arranged, and a string selection line SSL, a ground selection line GSL, and a common source line CSL are arranged perpendicular to the active regions ARs. A plurality of wordlines WL0 through WLm−1 are arranged between the string selection line SSL and the ground selection line GSL. In addition, a plurality of bitlines BL0 through BLn−1 cross the wordlines WL0 through WLm−1 in an alternating fashion. A plurality of memory cell transistors MC0 through MCm−1×n−1 are defined in regions where the bitlines BL0 through BLn−1 cross the wordlines WL0 through WLm−1, respectively. Also, a string selection transistor SST and a ground selection transistor GST are defined in regions where a bitline BL crosses the string selection line SSL and the ground selection line GSL. The string selection transistor SST, the memory cell transistors and the ground selection transistor GST are connected in series to form a string S. A drain of the string selection transistor SST of each string S is connected to the bitline BL by a bitline contact BLC. A source of the ground selection transistor GST is connected to the common source line CSL.

Figure 27:
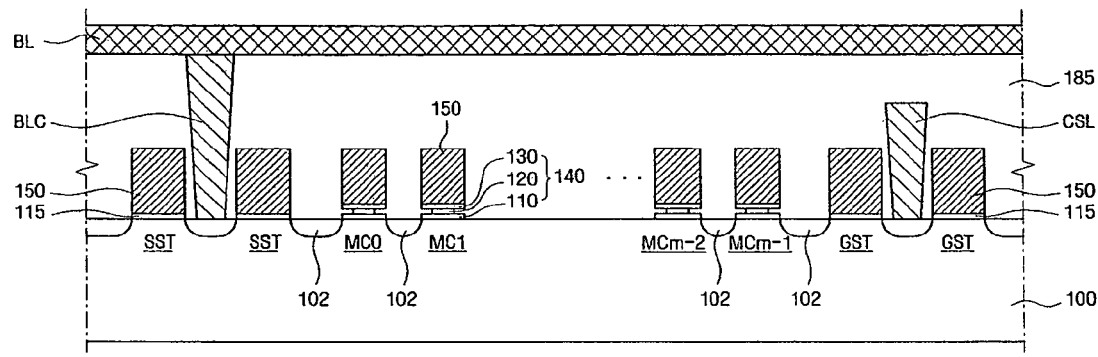
FIG. 27 is a cross-sectional view of the non-volatile semiconductor integrated circuit device taken along section line XXVII-XXVII' of FIG. 26.

FIG. 27 is a cross-sectional view of the non-volatile semiconductor integrated circuit device taken along section line XXVII-XXVII' of FIG. 26.

Referring to FIG. 27, the active regions ARs are defined by an isolation region 108 formed in a semiconductor substrate 100. A plurality of wells (not shown) may be formed in the semiconductor substrate 100 in order to optimize characteristics of transistors formed in a cell array region and a peripheral circuit region. For example, a pocket-type p-well may be formed in the cell array region, and n- and p-wells may be formed in the peripheral circuit region.

In each active region AR, the string selection transistor SST, the memory cell transistors MC0 through MCm−1 and the ground selection transistor GST are connected in series to form a string S and share impurity regions 102. The string S is connected to the bitline BL by the bitline contact BLC. The string selection transistor SST is coupled to the string selection line SSL, the memory cell transistors MC0 through MCm−1 are coupled respectively to the wordlines WL0 through WLm−1, and the ground selection transistor GST is coupled to the ground selection line GSL.

Each of the memory cell transistors MC0 through MCm−1 includes a charge trapping layer 120. That is, at least an end of the charge trapping layer 120 is recessed inwardly from an outer boundary of each cross region. A charge trapping structure 140 including a tunneling layer 110, the charge trapping layer 120 and a blocking layer 130 is illustrated as an example in FIG. 27. However, the charge trapping structures 140 through 142 according the various embodiments of the present invention of FIGS. 1 through 8 can also be applied.

The string selection transistor SST and the ground selection transistor GST may or may not include the charge trapping layer 120 described above. In FIG. 27, the string selection transistor SST and the ground selection transistor GST do not include the charge trapping layer 120, and a gate insulation film 115 is interposed between each gate electrode 150 and the semiconductor substrate 100. Reference numeral 180 indicates an inter-layer insulation film.

Figure 28:
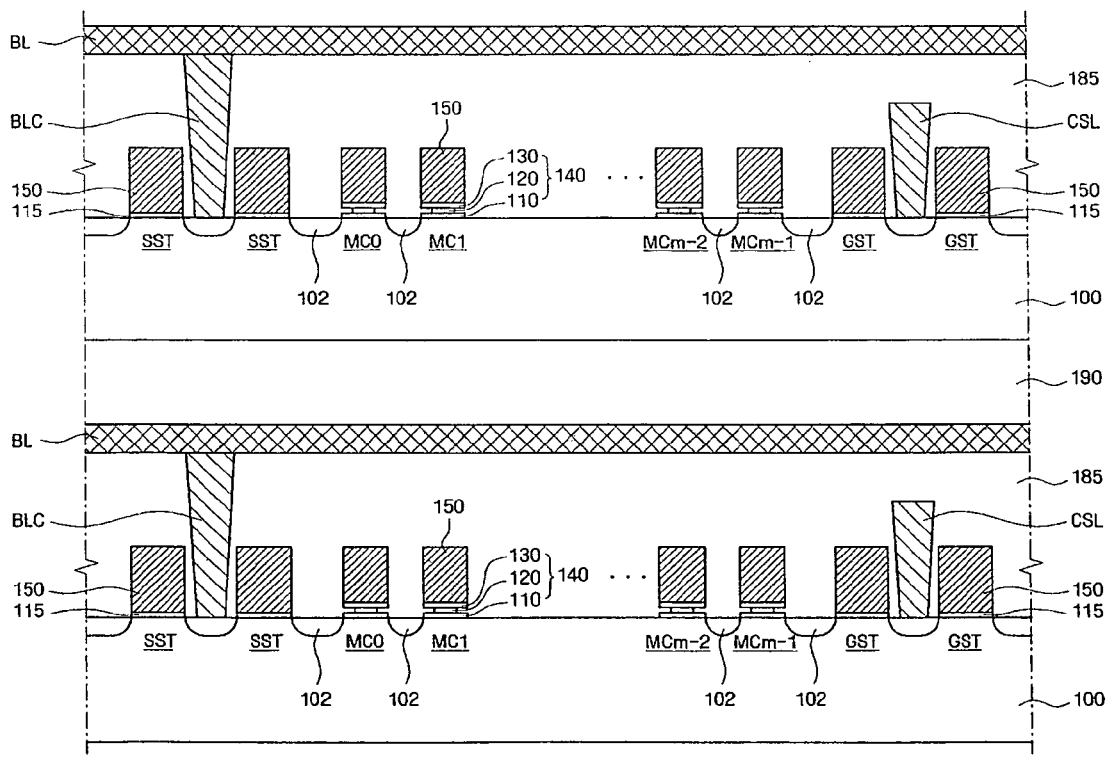
FIG. 28 is a cross-sectional view of a non-volatile semiconductor integrated circuit device according to another exemplary embodiment of the present invention.

FIG. 28 is a cross-sectional view of a non-volatile semiconductor integrated circuit device according to another exemplary embodiment of the present invention. The non-volatile semiconductor integrated circuit device of FIG. 28 has a structure in which the non-volatile semiconductor integrated circuit device of FIG. 27 is stacked in two layers. Referring to FIG. 28, an inter-layer insulation film 190 is interposed between a lower non-volatile semiconductor integrated circuit layer and an upper non-volatile semiconductor integrated circuit layer. The lower non-volatile semiconductor integrated circuit layer and the upper non-volatile semiconductor integrated circuit layer may have substantially similar structures or may have different structures when necessary. A semiconductor substrate 100 of the upper non-volatile semiconductor integrated circuit layer may be bonded and thus coupled onto the inter-layer insulation film 190. In a modified embodiment of the present invention, a semiconductor layer is applied as a base substrate of the upper non-volatile semiconductor integrated circuit layer. In this case, after an epitaxial or deposition process, the semiconductor layer is mono-crystallized or poly-crystallized by annealing or laser treatment. A device integration rate of the non-volatile semiconductor integrated circuit device of FIG. 28 can be increased.

Figure 29:
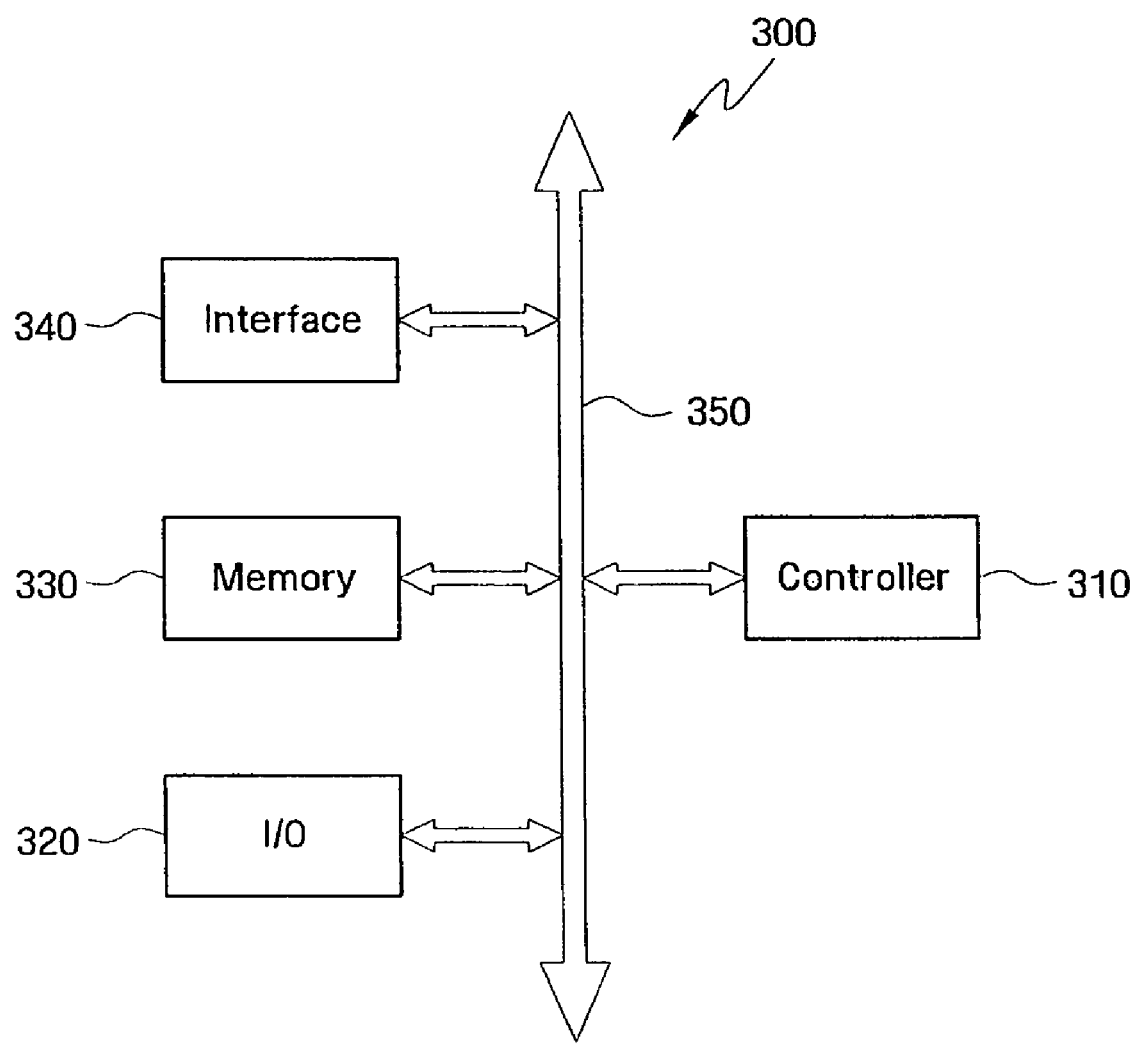
FIG. 29 is a schematic diagram illustrating a memory system according to an exemplary embodiment of the present invention.

Hereinafter, a memory system including a non-volatile memory device or a non-volatile semiconductor integrated circuit device such those described above will be disclosed. FIG. 29 is a schematic diagram illustrating a memory system 300 according to an exemplary embodiment of the present invention.

Referring to FIG. 29, the memory system 300 can be applied to a mobile system such as a personal digital assistant (PDA), a portable computer, a web tablet, a wireless phone, a mobile phone, a digital music player, a memory card, or an information transmitting and/or receiving system.

The memory system 300 includes a controller 310, an input/output (I/O) device 320 such as a keypad, a keyboard and a display, a memory 330, an interface 340, and a bus 350. The memory 330 and the interface 340 communicate with each other using the bus 350.

The controller 310 includes at least one microprocessor, a digital signal processor, a micro-controller, or other similar processing devices. The memory 330 may be used to store a command executed by the controller 310. The memory 330 includes a non-volatile memory device or a non-volatile semiconductor integrated circuit device according to the exemplary embodiments of the present invention.

The interface 340 transmits or receives data to/from a communication network.

A non-volatile memory device according to the present invention can have improved operating characteristics by, for example, preventing the difference between a threshold voltage during a programming operation and a threshold voltage during an erase operation. In addition, electrons can be accurately injected or removed.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

What is claimed is:

1. A non-volatile memory device comprising:
an active region;
a wordline formed on the active region to cross the active region;
a charge trapping layer interposed between the active region and the wordline;
a tunneling layer interposed between the charge trapping layer and a semiconductor substrate;
a blocking layer interposed between the charge trapping layer and the wordline; and
a filling insulation film filling recessed regions of the charge trapping layer, covering the active region, and having a top surface at the same level as the blocking layer;
wherein a cross region of the active region and the wordline comprises an overlap region in which the charge trapping layer is disposed and a non-overlap region in which the charge trapping layer is not disposed; and
wherein sidewalls of the tunneling layer and sidewalls of the blocking layer are aligned with an outer boundary of the cross region, and at least an end of the charge trapping layer is inwardly recessed from the sidewalls of the tunneling layer and the sidewalls of the blocking layer.

2. The device of claim 1, wherein the non-overlap region is a region in which at least an end of the charge trapping region is recessed inwardly from an outer boundary of the cross region.

3. The device of claim 1, wherein the non-overlap region is a peripheral region of the cross region.

4. The device of claim 1, wherein the charge trapping layer comprises a silicon nitride film, a silicon oxynitride film, a metal oxide or metal oxynitride film of Al, Zr, Hf, La or an alloy of Al, Zr, Hf and La, or a combination of the same.

5. The device of claim 1, wherein the tunneling layer, the charge trapping layer, and the blocking layer extend along the wordline.

6. A non-volatile memory device comprising:
an active region;
a wordline formed on the active region to cross the active region;
a charge trapping layer interposed between the active region and the wordline;
a tunneling layer interposed between the charge trapping layer and a semiconductor substrate; and
a blocking layer interposed between the charge trapping layer and the wordline;
wherein a cross region of the active region and the wordline comprises an overlap region in which the charge trapping layer is disposed and a non-overlap region in which the charge trapping layer is not disposed; and
wherein sidewalls of the blocking layer are aligned with an outer boundary of the cross region, sidewalls of the tunneling layer are aligned with sidewalls of the charge trapping layer, and at least an end of the charge trapping layer and at least an end of the tunneling layer are recessed inwardly from the sidewalls of the blocking layer.

7. The device of claim 6, further comprising a mold mask filling recessed regions of the charge trapping layer and recessed regions of the tunneling layer, covering the active region, and having a top surface at the same level as the charge trapping layer.

8. The device of claim 6, further comprising an inter-layer insulation film filling recessed regions of the charge trapping layer and the tunneling layer and having sidewalls aligned with the outer boundary of the cross region.

9. The device of claim 6, wherein the tunneling layer is formed on a surface of the semiconductor substrate, and wherein the blocking layer has sidewalls that are aligned with the outer boundary of the cross region.

10. A non-volatile semiconductor integrated circuit device comprising:
an active region defined by an isolation region;
a plurality of wordlines formed on the active region to cross the active region;
a plurality of impurity regions formed in the active region on both sides of each of the wordlines;
a plurality of charge trapping layers interposed between the active region and the wordlines, respectively;
a plurality of tunneling layers interposed between the charge trapping layers and a semiconductor substrate, respectively; and a plurality of blocking layers interposed between the charge trapping layers and the wordlines, respectively, wherein a cross region of the active region and each of the wordlines comprises an overlap region in which each of the charge trapping layers is disposed and a non-overlap region in which each of the charge trapping layers is not disposed, and wherein sidewalls of each of the blocking layers are aligned with an outer boundary of the cross region, sidewalls of each of the tunneling layers are aligned with sidewalls of each of the charge trapping layers, and at least an end of each of the charge trapping layers and at least an end of each of the tunneling layers are recessed inwardly from the sidewalls of each of the blocking layers.

11. The device of claim 10, further comprising a string selection line and a ground selection line formed on the active region to cross the active region, wherein the wordlines are interposed between the string selection line and the ground selection line.

12. A non-volatile semiconductor integrated circuit device having two or more stacked non-volatile semiconductor integrated circuit layers, at least one of the non-volatile semiconductor integrated circuit layers comprising:

an active region defined by an isolation region;

a plurality of wordlines formed on the active region to cross the active region;

a plurality of impurity regions formed in the active region on both sides of each of the wordlines;

a plurality of charge trapping layers interposed between the active region and the wordlines, respectively;

a plurality of tunneling layers interposed between the charge trapping layers and a semiconductor substrate, respectively; and a plurality of blocking layers interposed between the charge trapping layers and the wordline, respectively, wherein a cross region of the active region and each of the wordlines comprises an overlap region in which each of the charge trapping layers is disposed and a non-overlap region in which each of the charge trapping layers is not disposed; and wherein sidewalls of each of the blocking layers are aligned with an outer boundary of the cross region, sidewalls of each of the tunneling layers are aligned with sidewalls of each of the charge trappers in layers, and at least an end of each of the charge trapping layers and at least an end of each of the tunneling layers are recessed inwardly from the sidewalls of each of the blocking layers.

13. The device of claim 12, wherein the at least one of the non-volatile semiconductor integrated circuit layers further comprises a string selection line and a ground selection line formed on the active region to cross the active region, wherein the wordlines are interposed between the string selection line and the ground selection line.

* * * * *